(12) United States Patent
Chen et al.

(10) Patent No.: US 11,929,419 B2
(45) Date of Patent: Mar. 12, 2024

(54) SEMICONDUCTOR DEVICE

(71) Applicant: TAIWAN SEMICONDUCTOR MANUFACTURING CO., LTD., Hsinchu (TW)

(72) Inventors: Chang-Yin Chen, Taipei (TW); Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 318 days.

(21) Appl. No.: 17/129,253

(22) Filed: Dec. 21, 2020

(65) Prior Publication Data

US 2021/0111266 A1 Apr. 15, 2021

Related U.S. Application Data

(60) Continuation of application No. 16/914,940, filed on Jun. 29, 2020, now Pat. No. 10,872,965, which is a
(Continued)

(51) Int. Cl.
*H01L 29/49* (2006.01)
*H01L 21/28* (2006.01)
*H01L 29/66* (2006.01)
*H01L 21/02* (2006.01)
*H01L 21/027* (2006.01)
*H01L 21/033* (2006.01)
*H01L 21/3105* (2006.01)
(Continued)

(52) U.S. Cl.
CPC .... *H01L 29/4991* (2013.01); *H01L 21/28088* (2013.01); *H01L 29/6653* (2013.01); *H01L 29/66545* (2013.01); *H01L 29/6656* (2013.01); *H01L 29/66795* (2013.01); *H01L 21/0206* (2013.01); *H01L 21/02164* (2013.01); *H01L 21/0217* (2013.01); *H01L 21/02236* (2013.01); *H01L 21/02255* (2013.01); *H01L 21/02271* (2013.01); *H01L 21/02274* (2013.01); *H01L 21/0274* (2013.01); *H01L 21/0332* (2013.01); *H01L 21/0337* (2013.01); *H01L 21/31053* (2013.01); *H01L 21/31111* (2013.01); *H01L 21/3212* (2013.01); *H01L 21/76224* (2013.01); *H01L 29/4966* (2013.01)

(58) Field of Classification Search
None
See application file for complete search history.

(56) References Cited

U.S. PATENT DOCUMENTS 8,962,400 B2 2/2015 Tsai et al.
9,093,514 B2 7/2015 Tsai et al.
(Continued)

*Primary Examiner* — Evren Seven
(74) *Attorney, Agent, or Firm* — Birch, Stewart, Kolasch & Birch, LLP

(57) ABSTRACT

A device includes a semiconductive fin having source and drain regions and a channel region between the source and drain regions, a gate feature over the channel region of the semiconductive fin, a first spacer around the gate feature, source and drain features respectively in the source and drain regions of the semiconductive fin, an interlayer dielectric layer around the first spacer, and a void between the first spacer and the interlayer dielectric layer and spaced apart from the gate feature and the source and drain features.

20 Claims, 18 Drawing Sheets

Related U.S. Application Data division of application No. 16/047,038, filed on Jul. 27, 2018, now Pat. No. 10,700,180.

(51) Int. Cl.
  *H01L 21/311* (2006.01)
  *H01L 21/321* (2006.01)
  *H01L 21/762* (2006.01)

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,065 | B1 | 3/2017 | Bergendahl et al. |
| 9,608,116 | B2 | 3/2017 | Ching et al. |
| 9,666,533 | B1 | 5/2017 | Basker et al. |
| 9,812,363 | B1 | 11/2017 | Liao et al. |
| 9,859,380 | B2 | 1/2018 | Lee et al. |
| 10,026,824 | B1 | 7/2018 | Chanemougame et al. |
| 10,367,076 | B1 | 7/2019 | Cheng et al. |
| 2014/0110798 | A1 | 4/2014 | Cai et al. |
| 2016/0163816 | A1* | 6/2016 | Yu ............... H01L 29/6653 438/283 |
| 2016/0181143 | A1* | 6/2016 | Kwon ............ H01L 21/764 438/586 |
| 2016/0284806 | A1 | 9/2016 | Park et al. |
| 2016/0365426 | A1* | 12/2016 | Ching ............ H01L 29/785 |
| 2017/0162650 | A1 | 6/2017 | Cheng et al. |
| 2017/0194423 | A1 | 7/2017 | Lin |
| 2018/0138280 | A1* | 5/2018 | Li ............... H01L 29/4991 |
| 2018/0182845 | A1 | 6/2018 | Seong et al. |
| 2018/0233398 | A1* | 8/2018 | Van Cleemput ............ H01L 21/67069 |
| 2018/0269301 | A1* | 9/2018 | Cheng ............ H01L 29/401 |
| 2018/0323276 | A1 | 11/2018 | Kang et al. |
| 2018/0374927 | A1 | 12/2018 | Liu et al. |
| 2019/0043959 | A1 | 2/2019 | Lee et al. |
| 2019/0148501 | A1 | 5/2019 | Chen et al. |
| 2019/0157414 | A1 | 5/2019 | Ando et al. |
| 2019/0165121 | A1 | 5/2019 | Park |
| 2019/0296123 | A1 | 9/2019 | Lee et al. |
| 2019/0334008 | A1 | 10/2019 | Chen et al. |
| 2019/0393335 | A1 | 12/2019 | Economikos et al. |
| 2020/0027959 | A1 | 1/2020 | Cheng et al. |
| 2020/0127109 | A1 | 4/2020 | Wang et al. |
| 2020/0219989 | A1 | 7/2020 | Cheng |

\* cited by examiner

SEMICONDUCTOR DEVICE

CROSS-REFERENCE TO RELATED APPLICATION

This application is continuation of U.S. application Ser. No. 16/914,940, filed Jun. 29, 2020, now U.S. Pat. No. 10,872,965, issued Dec. 22, 2020, which is a divisional of U.S. application Ser. No. 16/047,038, filed Jul. 27, 2018, now U.S. Pat. No. 10,700,180, issued Jun. 30, 2020, all of which are incorporated herein by reference in their entirety.

BACKGROUND

As the semiconductor industry has strived for higher performance, higher device density, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The gate in the transistor crosses over the channel region of the fin. This configuration allows the gate to induce current flow in the channel from three sides. Thus, FinFET devices have the advantage of higher current flow and reduced short-channel effects.

The dimensions of FinFETs and other metal oxide semiconductor field effect transistors (MOSFETs) have been reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
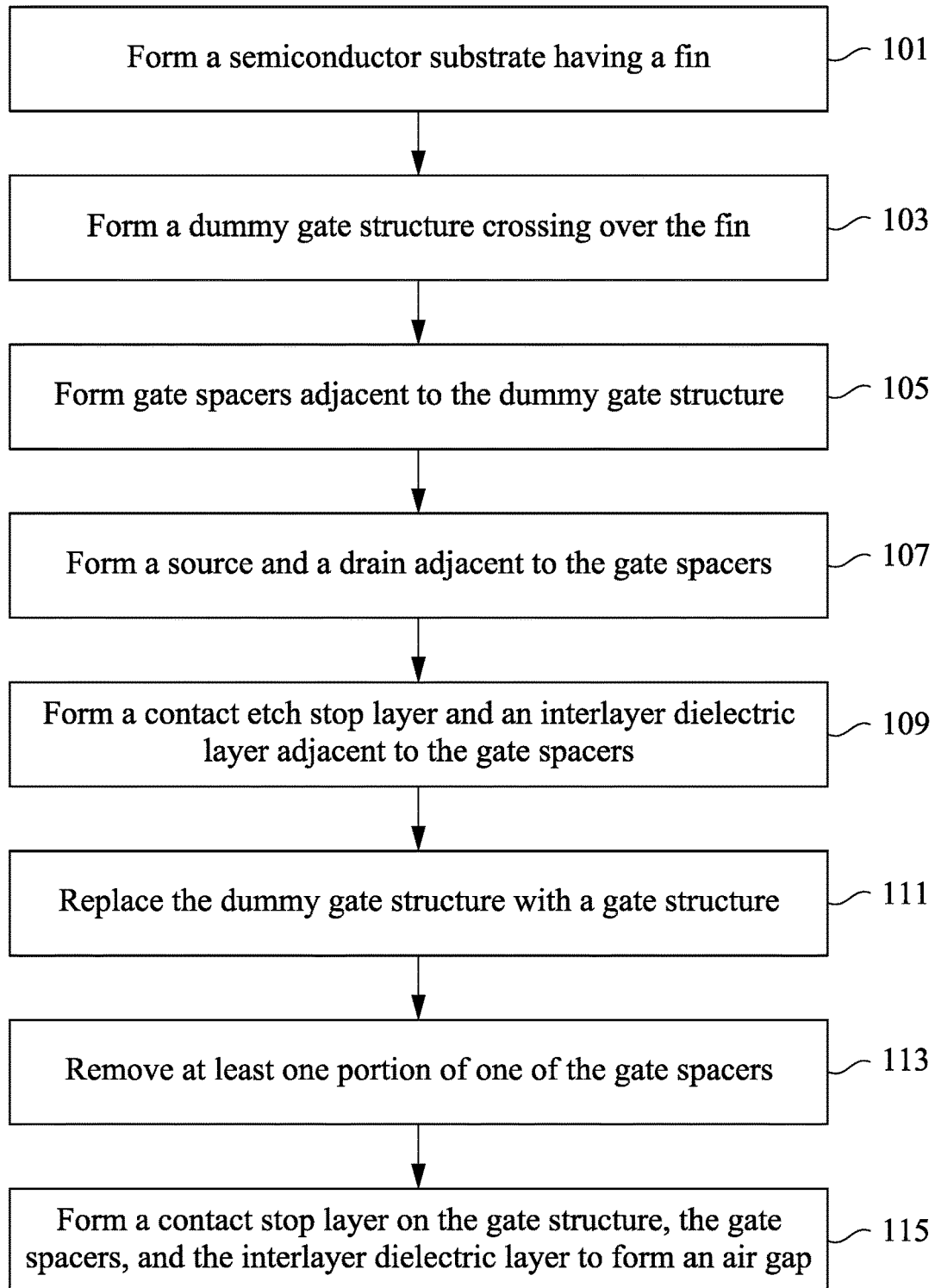
FIG. 1 is a flowchart of a method for manufacturing a semiconductor structure, in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The instant disclosure provides a method for manufacturing a semiconductor structure. FIG. 1 is a flowchart of a method 100 for manufacturing a semiconductor structure, in accordance with some embodiments of the instant disclosure. Operation 101 of the method is forming a semiconductor substrate having a fin. The method continues with operation 103 in which a dummy gate structure is formed to cross over the fin. Operation 105, gate spacers are formed adjacent to the dummy gate structure. The method continues with operation 107 in which a source and a drain are formed adjacent to the gate spacers. The method continues with operation 109 in which a contact etch stop layer and an interlayer dielectric layer are formed adjacent to the gate spacers. The method continues with operation 111 in which the dummy gate structure is replaced with a gate structure. Operation 113, at least one portion of one of the gate spacers is removed. The method continues with operation 115 in which a contact stop layer is formed on the gate structure, the gate spacers, and the interlayer dielectric layer to form an air gap. It is understood that FIG. 1 has been simplified for a good understanding of the concepts of the instant disclosure. Accordingly, it should be noted that additional processes may be provided before, during, and after the methods of FIG. 1, and that some other processes may only be briefly described herein.

FIGS. 2-14 are perspective views illustrating intermediate stages in the manufacturing of a semiconductor structure, in accordance with some embodiments of the instant disclosure.

Figure 2:
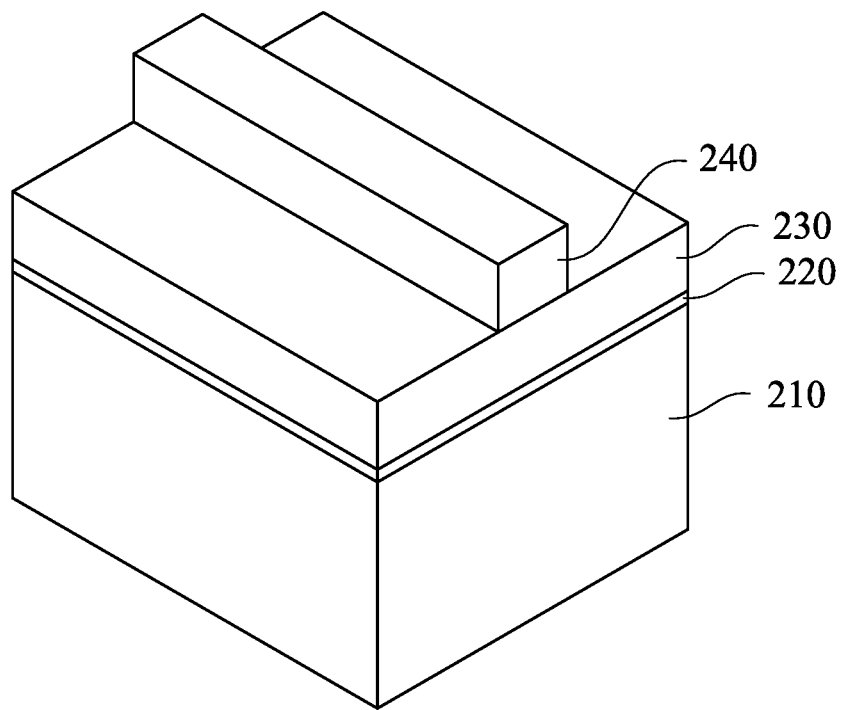
FIGS. 2-14 are perspective views illustrating intermediate stages in the manufacturing of a semiconductor structure, in accordance with some embodiments of the instant disclosure.

In the operation 101 of FIG. 1, a semiconductor substrate having a fin is formed. Please refer to FIGS. 2-6. As shown in FIG. 2, a semiconductor substrate 210 is illustrated. In some embodiments, the semiconductor substrate 210 is a bulk semiconductor, a semiconductor-on-insulator (SOI) substrate, or the like. For example, the substrate 210 may be a wafer, such as a silicon wafer. Generally, an SOI substrate includes an insulator layer and a layer of a semiconductor material thereon. For example, the insulator layer may be a buried oxide (BOX) layer, a silicon oxide layer, or the like. The insulator layer is provided on a substrate, a silicon, or a glass substrate. Other substrates, such as a multi-layered or gradient substrate may also be used. In some embodiments, the semiconductor material of the semiconductor substrate 210 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Stilled referring to FIG. 2, a pad layer 220 is formed on the semiconductor substrate 210, a mask layer 230 is formed on the substrate 210, and a photo-sensitive layer 240 is formed on the mask layer 230. The pad layer 220 may act as an adhesion layer between the substrate 210 and mask layer 230, and may also act as an etch stop layer for etching the mask layer 230. The mask layer 230 may be used as a hard mask during photolithography processes. In some embodiments, the pad layer 220 is formed using thermal oxidation process. For example, the pad layer 220 is a thin film including silicon oxide formed by a thermal oxidation process. In some embodiments, the mask layer 230 is formed using low-pressure chemical vapor deposition (LPCVD) or plasma enhanced chemical vapor deposition (PECVD). For example, the mask layer 230 includes silicon nitride.

Figure 3:
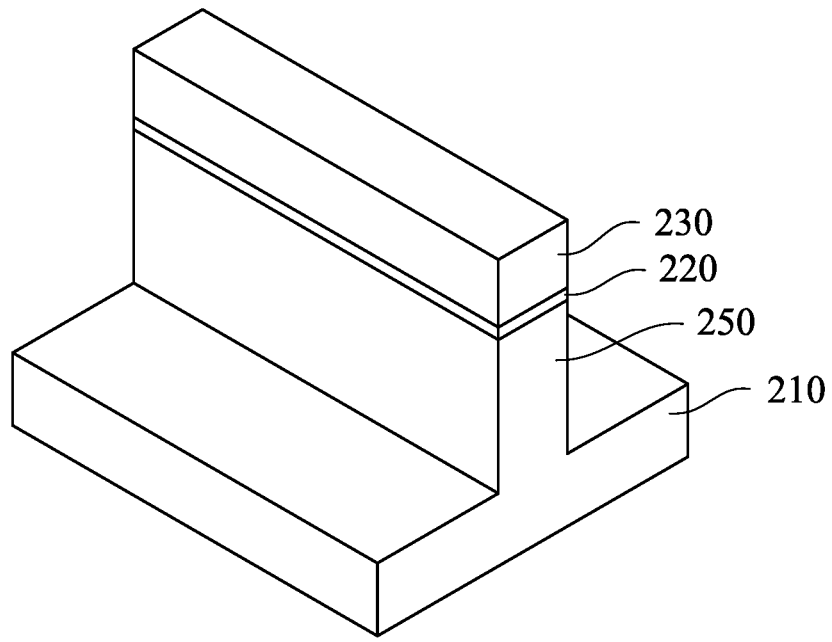

As shown in FIG. 3, portions of the mask layer 230 and the pad layer 220 not covered and protected by the photo-sensitive layer 240 are etched to expose the semiconductor substrate 210, and the semiconductor substrate 210 is then etched to form a fin 250 of the semiconductor substrate 210. Next, the photo-sensitive layer 140 may be removed. A cleaning step may be optionally performed to remove a native oxide of the semiconductor substrate 210. The cleaning may be performed using diluted hydrofluoric (HF) acid, for example.

Figure 4:
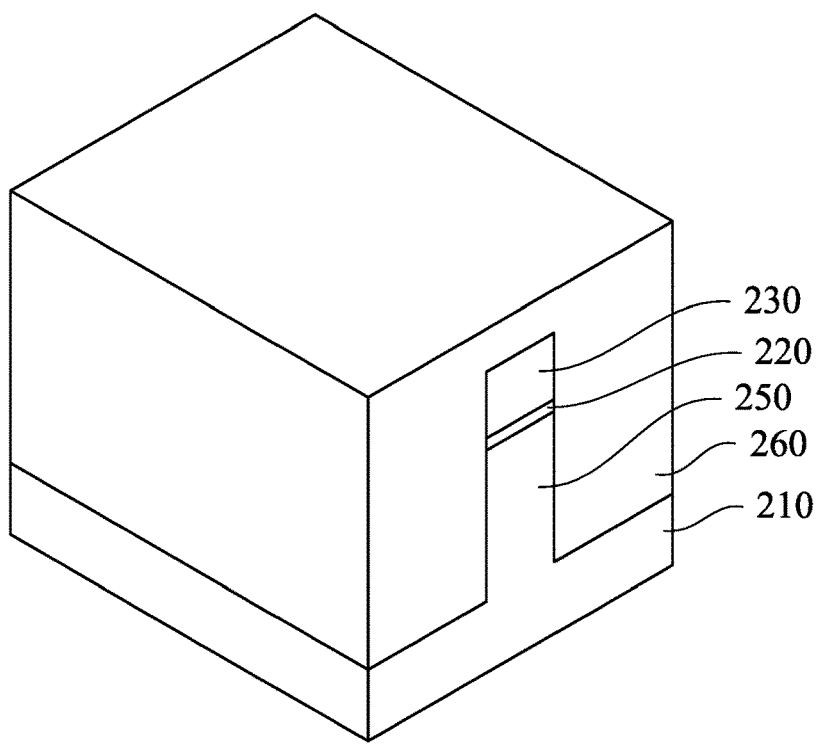

Please refer to FIG. 4. An isolation dielectric layer 260 is formed to cover the mask layer 230, the pad layer 220, and the fin 250. In some embodiments, the isolation dielectric layer 260 is formed using a high-density-plasma (HDP) chemical vapor deposition (CVD) process, a sub-atmospheric CVD (SACVD) process, a high aspect-ratio process (HARP), or spin-on-dielectric (SOD) process. For example, the isolation dielectric layer 260 includes silicon oxide, silicon nitride, silicon oxynitride, fluoride-doped silicate glass (FSG), or other low-K dielectric materials. Other processes and materials may be used.

Figure 5:
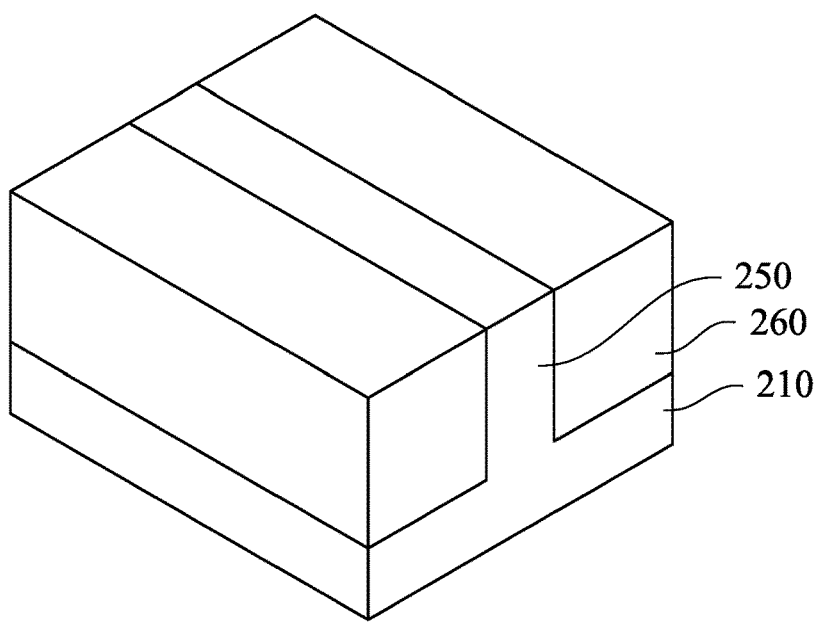

As shown in FIG. 5, a planarization process is performed to remove a portion of the isolation dielectric layer 260, the mask layer 230, and the pad layer 220 to expose the fin 250. For example, the planarization process is a chemical mechanical polish (CMP) process. In embodiments, the planarization process is performed to remove a portion of the isolation dielectric layer 260 to expose the mask layer 230, which may act as the CMP stop layer. Subsequently, the mask layer 230, if formed of silicon nitride, may be remove by a wet process using hot $H_3PO_4$, and the pad layer 220, if formed of silicon oxide, may be removed using diluted HF, according to some examples of the present disclosure.

Figure 6:
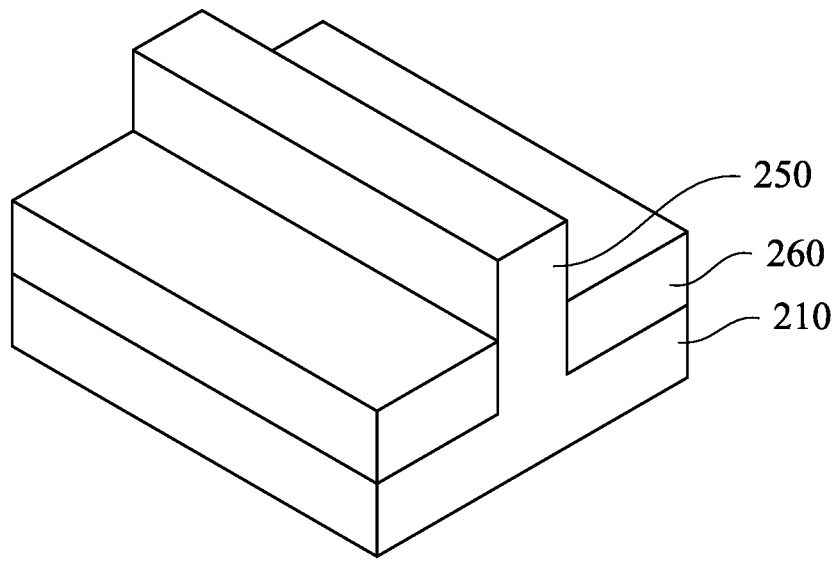

Please refer to FIG. 6. The isolation dielectric layer 260 is recessed, for example, through an etching operation, wherein diluted HF, SiCoNi (including HF and $NH_3$), or the like, may be used as the etchant. In some embodiments, the isolation dielectric layer 260 is referred to as shallow trench isolation (STI) structure. After recessing the isolation dielectric layer 260, a top surface of the fin 250 is higher than a top surface of the isolation dielectric layer 260. Therefore, an upper portion of the fin 250 protrudes above the isolation dielectric layer 260, and a lower portion of the fin 250 is embedded in the isolation dielectric layer 260.

Figure 7:
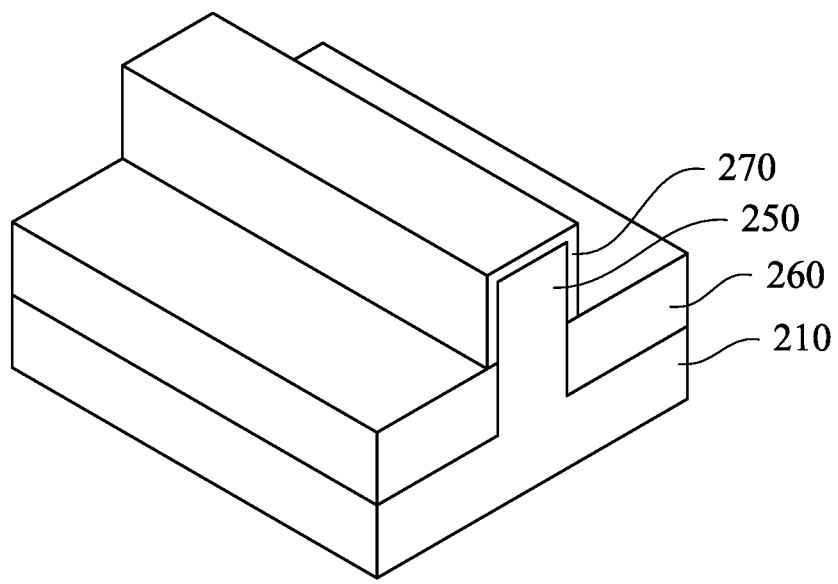
Figure 8:
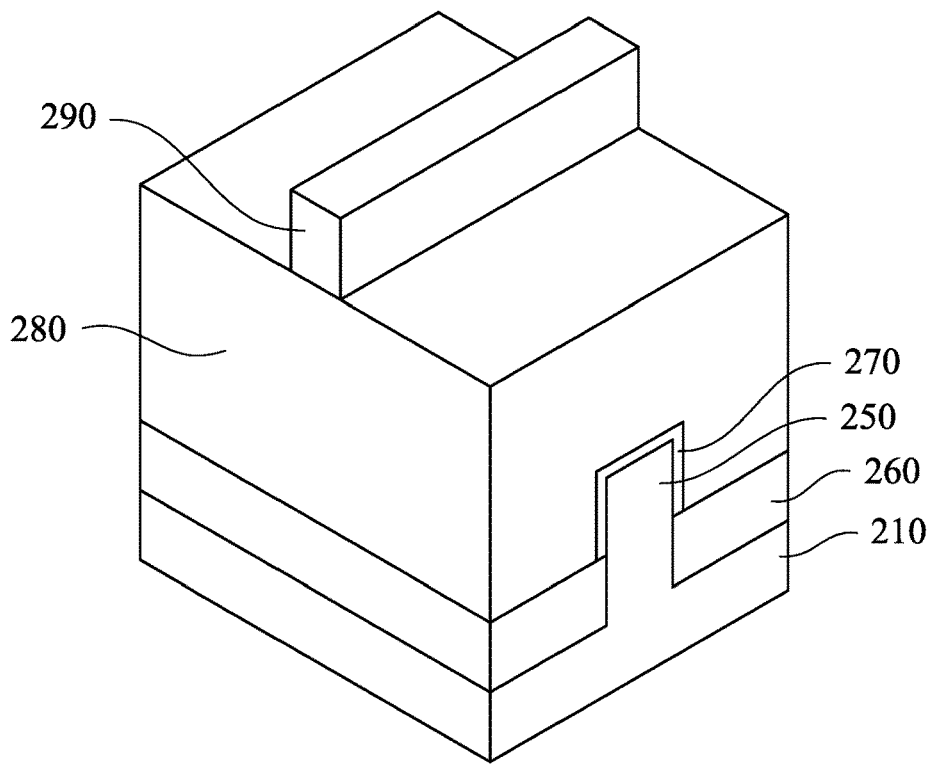
Figure 9:
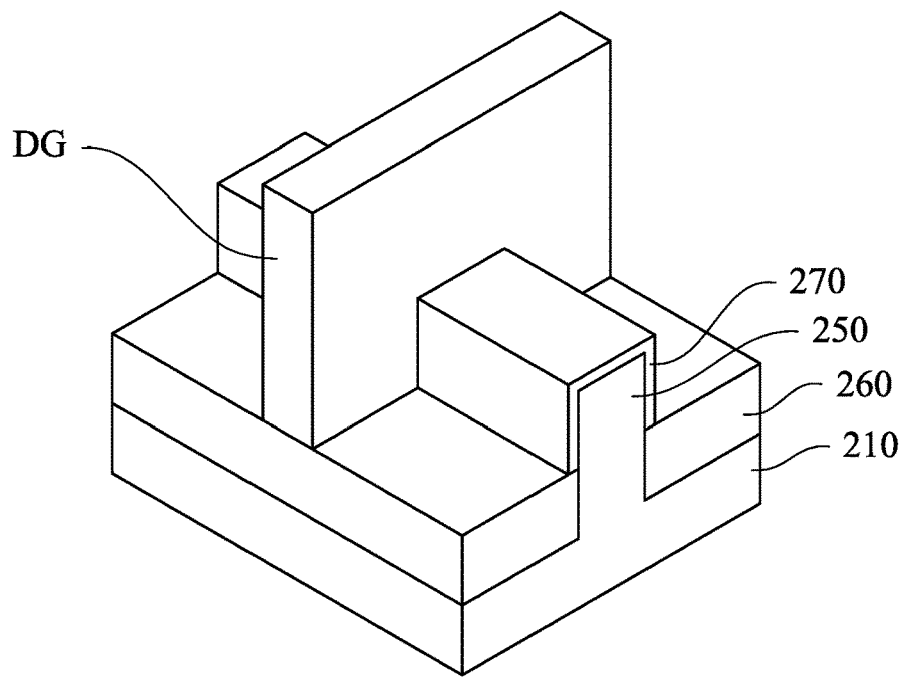

In the operation 103 of FIG. 1, a dummy gate structure is formed to cross over the fin. Reference is made to FIGS. 7-9. As shown in FIG. 7, a gate oxide layer 270 is formed to wrap the fin 250, and portions of the isolation dielectric layer 260 are not covered by the gate oxide layer 270. In some embodiments, the gate oxide layer 270 is formed using a deposition processes, such as chemical vapor deposition (CVD), physical vapor deposition (PVD), atomic layer deposition (ALD), plasma enhanced CVD (PECVD) or other suitable techniques. In some embodiments, the gate oxide layer 270 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide ($ZrO_2$), zirconium silicon oxide (ZrSiO4), lanthanum oxide ($La_2O_3$), titanium oxide ($TiO_2$), tantalum pentoxide ($Ta_2O_5$), strontium titanium oxide ($SrTiO_3$), aluminum oxide ($Al_2O_3$), hafnium dioxide-alumina ($HfO_2$—$Al_2O_3$) alloy, scandium oxide ($Sc_2O_3$), barium strontium titanium oxide ($BaO_6SrTi_2$), yttrium oxide ($Y_2O_3$), a combination thereof, or other suitable dielectric materials. The gate oxide layer 270 may include various dielectric materials, either individually or in combination.

Please refer to FIG. 8. After the gate oxide layer 270 is formed, a dummy gate electrode layer 280 is subsequently formed over the gate oxide layer 270, and a mask layer 290 is formed on the dummy gate electrode layer 280. In some embodiments, the dummy gate electrode layer 280 is deposited by CVD, PVD, sputter deposition, or other techniques suitable for depositing conductive materials. In some embodiments, the dummy gate electrode layer 280 includes polycrystalline-silicon (poly-Si), polycrystalline silicon-germanium (poly-SiGe), metallic nitrides, metallic silicides, metallic oxides, or metals. In some embodiments, the dummy gate electrode layer 280 includes a metal-containing material such as TiN, TaN, TaC, Co, Ru, Al, combinations thereof, or multi-layers thereof. The mask layer 290 may be hard masks for protecting the underlying dummy gate electrode layer 280 against subsequent etching process. The mask layer 290 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

The dummy gate electrode layer 280 is then etched, using the mask layer 290 as an etching mask, to form a dummy gate structure DG crossing over the fin 250 of the semiconductor substrate 210, as shown in FIG. 9. More specifically, a portion of the fin 250 is wrapped by the dummy gate structure DG. The gate oxide layer 270 is disposed between the fin 250 and the dummy gate structure DG. In some embodiments, the dummy gate structure DG has a longitudinal axis substantially perpendicular to a longitudinal axis of the fin 250. In some embodiments, the dummy gate structure DG may be later replaced with a replacement gate structure using a "gate-last" or replacement-gate process.

Figure 10:
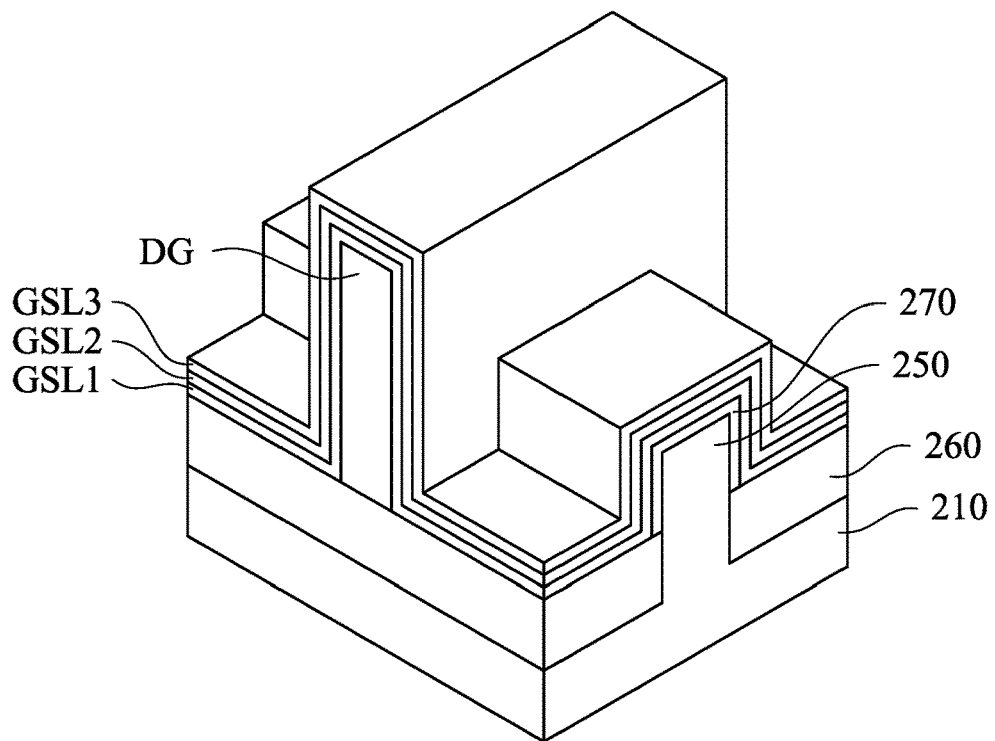

In the operation 105 of FIG. 1, gate spacers are formed adjacent to the dummy gate structure. Attention is now invited to FIGS. 10-11. In embodiments, as shown in FIG. 10, a gate spacer layer GSL1 is blanket formed over the dummy gate structure DG, the fin 250, and the isolation dielectric layer 260, a gate spacer layer GSL2 is formed on the gate spacer GSL1, and a gate spacer layer GSL3 is formed on the gate spacer layer GSL2. In some embodiments, the gate spacer layer GSL1 is conformally formed on the dummy gate structure DG, the fin 250, and the isolation dielectric layer 260. The gate spacer layer GSL2 is conformally formed on the gate spacer layer GSL1. The gate spacer layer GSL3 is conformally formed on the gate spacer layer GSL2. For example, the gate spacer layer GSL1, the gate spacer layer GSL2, and the gate spacer layer GSL3 independently include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric material. In some embodiments, the gate spacer layer GSL2 includes a material different from that of the gate spacer layer GSL1 and/or the gate spacer layer GSL3. In some embodiments, the gate spacer layer GSL2 has an etch resistance different from that of the gate spacer layer GSL1 and/or the gate spacer layer GSL3, with respect to an identical etchant. In some embodiments, the gate spacer layer GSL2 has an etch resistance lower than that of the gate spacer layer GSL1 and/or the gate spacer layer GSL3, with respect to an identical etchant. In some embodiments, the gate spacer layer GSL1, the gate spacer layer GSL2, and the gate spacer layer GSL3 respectively have a thickness ranged from about 5 Å to about 1000 Å.

Figure 11:
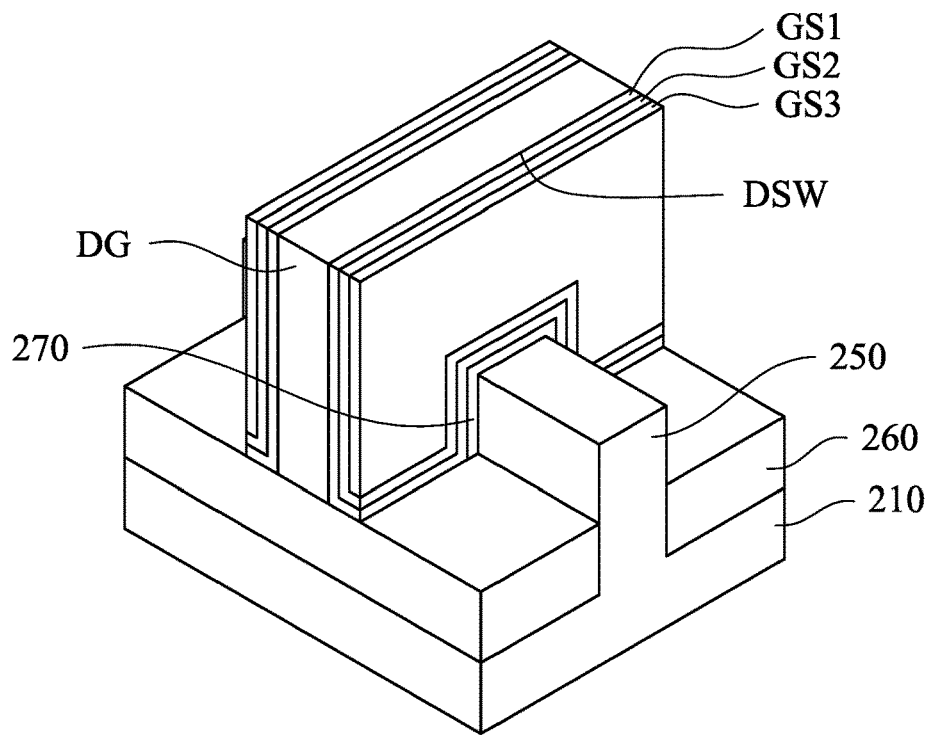

Please refer to FIG. 11. In some embodiments, the gate spacer layer GSL1, the gate spacer layer GSL2, the gate spacer layer GSL3, the gate oxide layer 270 are etched to expose a portion of the fin 250 and the isolation dielectric layer 260, thereby forming a gate spacer GS1 adjacent to the dummy gate structure DG, a gate spacer GS2 adjacent to the gate spacer GS1, and a gate spacer GS3 adjacent to the gate spacer GS2. As such, the gate spacer GS1 is formed to cover a sidewall DSW of the dummy gate structure DG. The gate spacer GS2 is formed on the gate spacer GS1. The gate spacer GS3 is formed on the gate spacer GS2. In examples, the gate spacer GS1, the gate spacer GS2, and the gate spacer GS3 independently include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric material. In some embodiments, the gate spacer GS2 includes a material different from that of the gate spacer GS1 and/or the gate spacer GS3. In yet some embodiments, the gate spacer GS2 has an etch resistance different from that of the gate spacer GS1 or the gate spacer GS3. In some embodiments, the gate spacer GS2 has an etch resistance lower than that of the gate spacer GS1 or the gate spacer GS3. In some embodiments, the gate spacer GS1, the gate spacer GS2, and the gate spacer GS3 respectively have a thickness of from about 5 Å to about 1000 Å.

Figure 12:
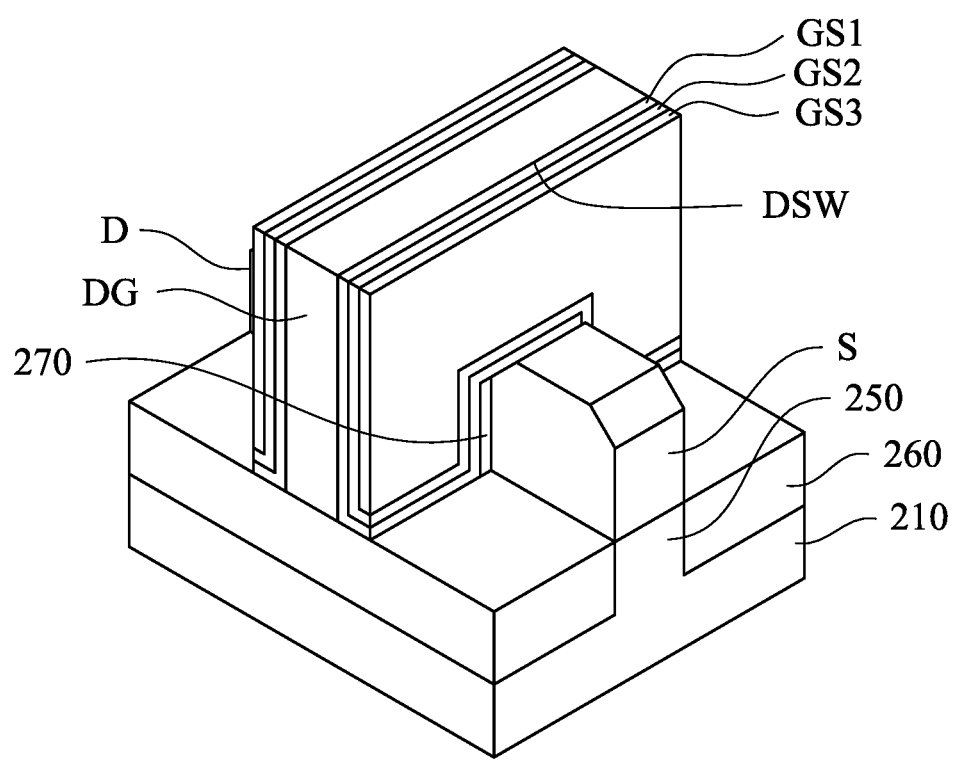

In the operation 107 of FIG. 1, a source and a drain is formed adjacent to the gate spacers. Referring to FIG. 12, a source S and a drain D are formed adjacent to the gate spacers GS1, GS2, GS3. In some embodiments, the source S and the drain D are formed by the steps described below. The exposed portions of the fin 250 are partially removed (or partially recessed) to form recesses. Subsequently, one or more epitaxy or epitaxial (epi) processes are performed to form the source S and the drain D. In examples, the source S and the drain D may include Si features, SiGe features, silicon phosphate (SiP) features, silicon carbide (SiC) features and/or other suitable features with a crystalline. For example, the source S and the drain D may include GaAs, GaP, GaN, InP, InAs, InSb, GaAsP, AlGaN, AlInAs, AlGaAs, GaInAs, GaInP, GaInAsP, or a combination thereof.

Figure 13:
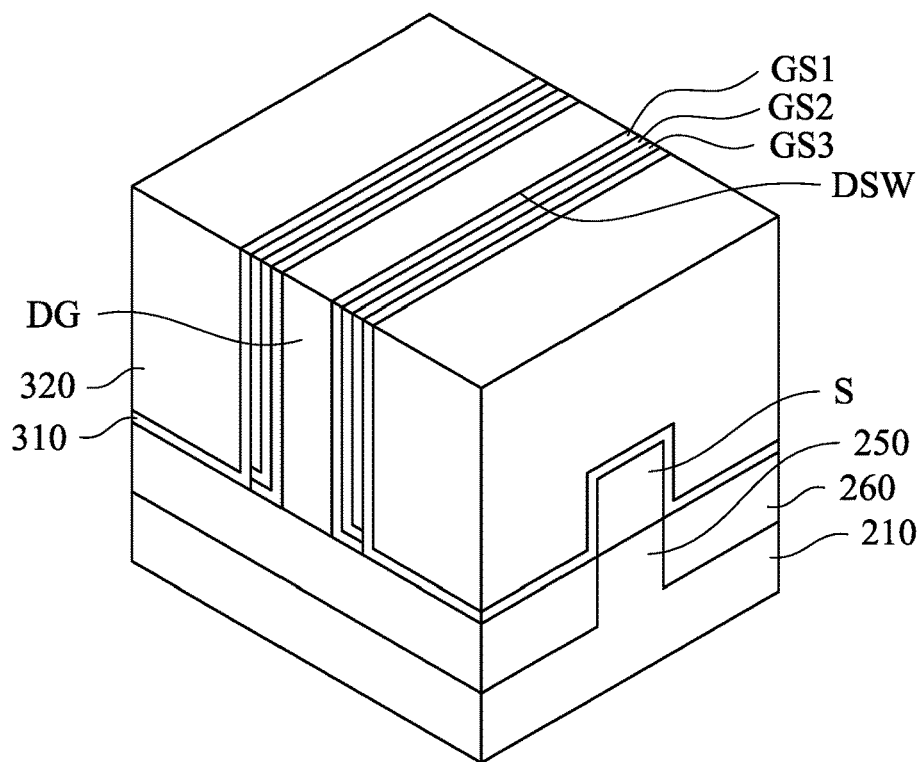

In the operation 109 of FIG. 1, a contact etch stop layer and an interlayer dielectric layer are formed adjacent to the gate spacers. Turning now to FIG. 13, in some embodiments, a contact etch stop layer (CESL) 310 is formed adjacent to the gate spacer GS3. The interlayer dielectric layer (ILD) 320 is formed adjacent to the CESL 310. More specifically, the CESL 310 is interposed between the gate spacer GS3 and the interlayer dielectric layer (ILD) 320. In some embodiments, the CESL 310 and the ILD layer 320 are formed by the steps described below. A CESL material layer is blanket deposited covering the structure shown in FIG. 12, and then an ILD material layer is blanket deposited covering the CESL. Afterwards, a CMP process may be performed to remove excessive portions of the ILD material layer and the CESL material layer to expose the dummy gate structure DG. In some embodiments, the CMP process may planarize the top surface of the ILD layer 320 with the top surfaces of the dummy gate structure DG. In example, the CESL 310 may include a dielectric material, such as SiN, SiON, SiCON, SiC, SiOC, SiCxNy, SiOx, or a combination thereof.

In some embodiments, the CESL material layer may be deposited using plasma enhanced chemical vapor deposition (PECVD), sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), or plasma impulse chemical vapor deposition (PICVD). In some embodiments, the CESL 310 has a thickness of from about 5 Å to about 500 Å.

In some embodiments, the ILD material layer may be formed by CVD, ALD, spin-on-glass (SOG) or other suitable techniques. In some embodiments, the ILD layer 320 includes a material different from that of the CESL 310. For example, the ILD layer 320 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In the operation 111 of FIG. 1, the dummy gate structure is replaced with a gate structure. Attention is now invited to FIG. 14. The dummy gate structure DG is replaced with a gate structure G crossing over the fin 250 of the semiconductor substrate 210. The gate structure G includes a gate dielectric layer 362, a barrier layer 364, and a work function conductor layer 366. In some embodiments, the gate structure G is a high-k metal gate (HKMG), in which the gate dielectric layer 362 is made of a high-k dielectric material.

In some embodiments, the gate structure G may be formed by the steps described below. The dummy gate structure DG is removed to form a trench exposing the first gate spacer GS1. A layer of gate dielectric is conformally formed to cover the inner surface of the trench. In some embodiments, the layer of gate dielectric is formed using a deposition processes, such as CVD, PVD, ALD, plasma enhanced CVD (PECVD) or other suitable techniques. For example, the layer of gate dielectric is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide ($ZrO_2$), zirconium silicon oxide (ZrSiO4), lanthanum oxide ($La_2O_3$), titanium oxide ($TiO_2$), tantalum pentoxide ($Ta_2O_5$), strontium titanium oxide ($SrTiO_3$), aluminum oxide ($Al_2O_3$), hafnium dioxide-alumina ($HfO_2$—$Al_2O_3$) alloy, scandium oxide ($Sc_2O_3$), barium strontium titanium oxide ($BaO_6SrTi_2$), yttrium oxide ($Y_2O_3$), a combination thereof, or other suitable dielectric materials. The layer of gate dielectric may include various dielectric materials, either individually or in combination.

Thereafter, in some embodiments, a layer of barrier material is conformally formed on the layer of gate dielectric. In some embodiments, the layer of barrier material is formed using ALD, CVD, LPCVD or MLD. For example, the barrier material may include TiN, TaN, AlN, SiN, TiC, TaC, AlC, SiC or a combination thereof. In some embodiments, the layer of barrier material may be omitted.

Thereafter, in some embodiments, a layer of work function conductor material is conformally formed on the barrier layer 364. In some embodiments, the layer of work function conductor material includes W, Al, Cu, AlCu, Ti, TiAlN, TaC, TaCN, TaSiN, Mn, Zr, TiN, Ta, TaN, Co, Ni, or a combination thereof. In some embodiments, the layer of work function conductor material has a thickness of about 5 Å to about 500 Å. In some embodiments, the layer of work function conductor material includes a material different from that of the barrier layer 364.

Figure 14:
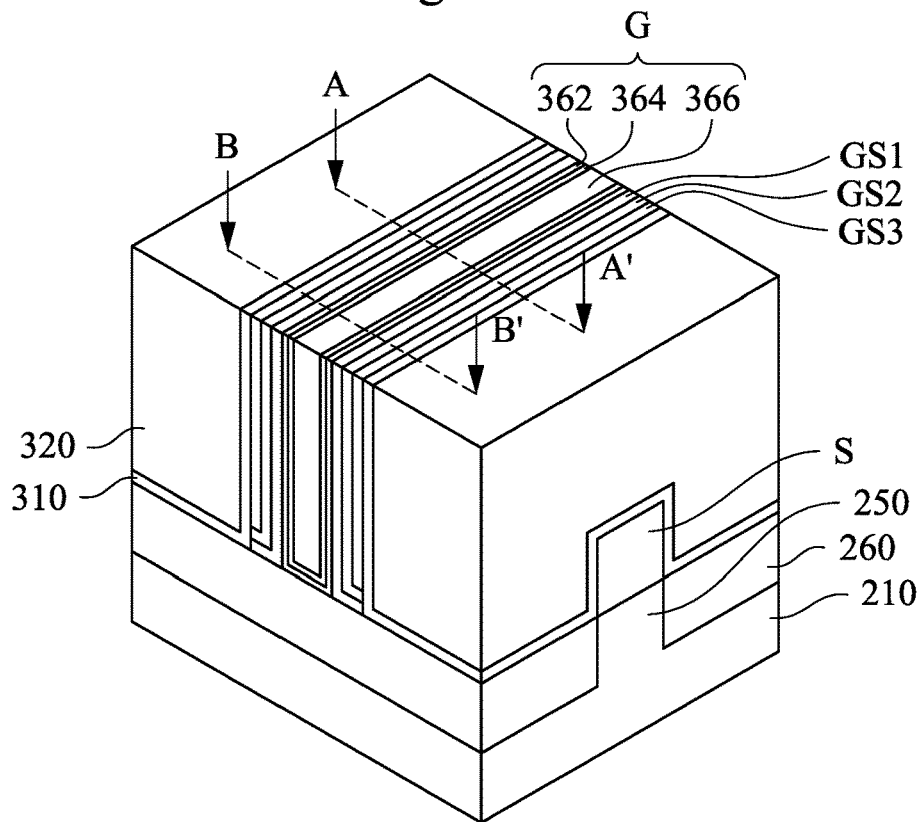

Thereafter, a CMP is carried out to polish the deposited layers of work function conductor material, barrier material, and the gate dielectric to obtain the structure depicted in FIG. 14.

Figure 15A:
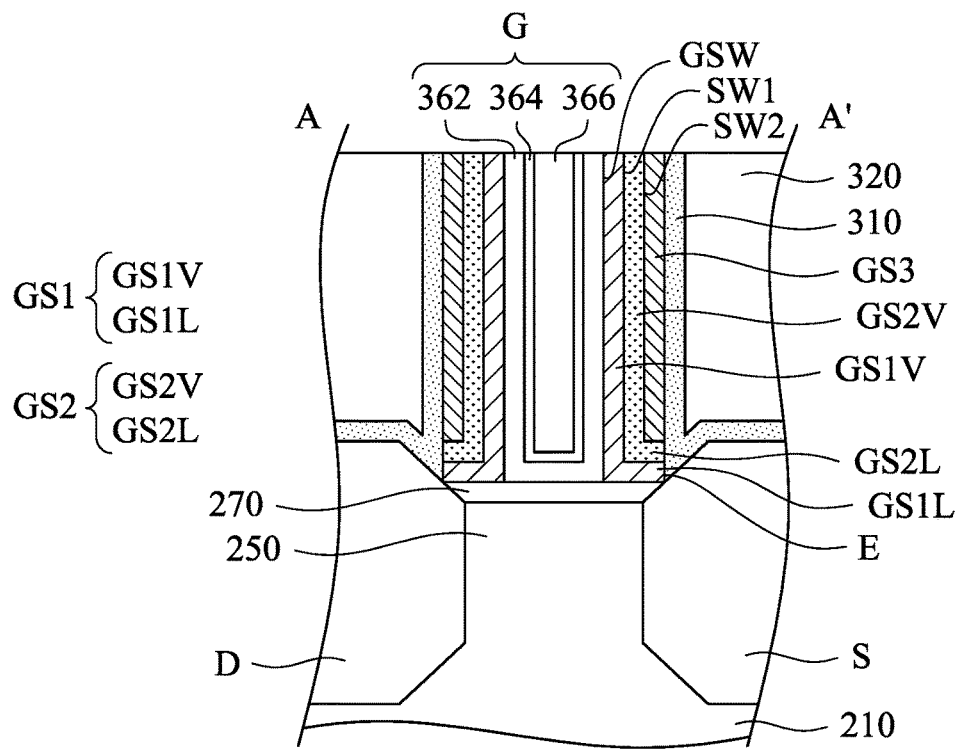
FIG. 15A is a cross-sectional view along a line A-A' in FIG. 14.
Figure 15B:
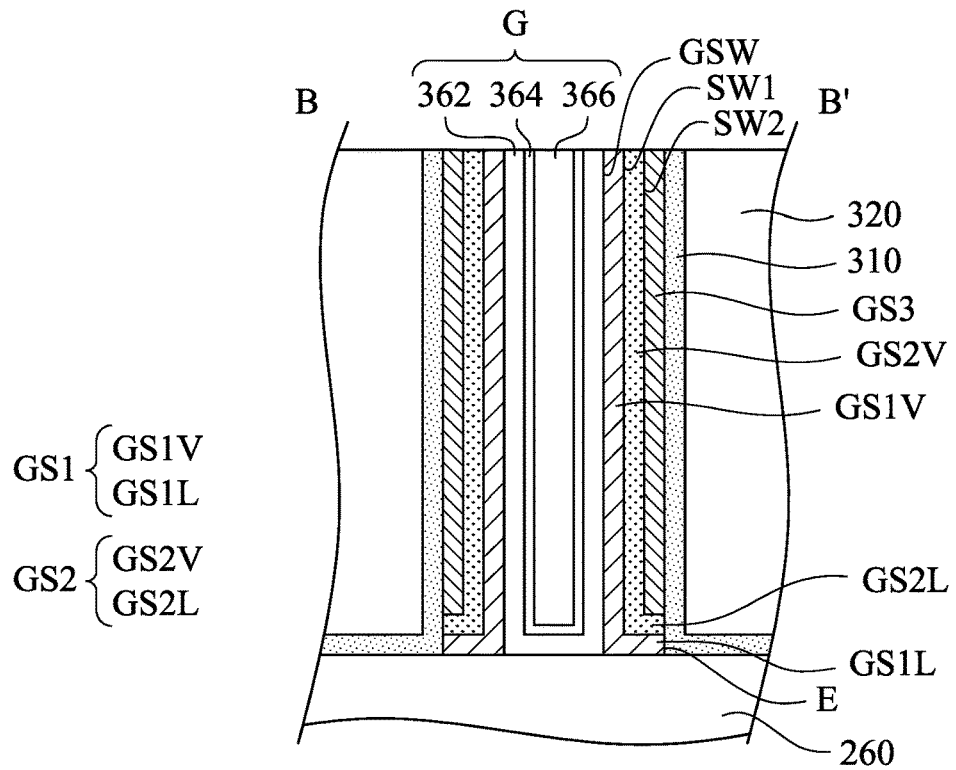
FIG. 15B is a cross-sectional view along a line B-B' in FIG. 14.

Attention is now invited to FIGS. 14, 15A, and 15B. FIG. 15A is a cross-sectional view along a line A-A' in FIG. 14. FIG. 15B is a cross-sectional view along a line B-B' in FIG. 14. The gate structure G is disposed on the semiconductor substrate 210. More specifically, the gate structure G has a part disposed on the fin 250 of the semiconductor substrate 210 as shown in FIG. 15A, and a part disposed on the isolation dielectric layer 260 as shown in FIG. 15B. The gate oxide layer 270 may be disposed between the gate structure G and the fin 250 as shown in FIG. 15A. Referring to FIGS. 15A and 15B simultaneously, the gate spacer GS1 abuts the sidewall GSW of the gate structure G. More specifically, the gate spacer GS1 has a vertical portion GS1V on the sidewall GSW of the gate structure G and a lateral portion GS1L that extends from a bottom of the vertical portion GS1V away from the gate structure G. In some embodiments, the gate spacer GS1 has an L-shape cross-section. The gate spacer GS2 is in contact with the gate spacer GS1, and has a vertical portion GS2V on a sidewall SW1 of the gate spacer GS1 and a lateral portion GS2L that extends from a bottom of the vertical portion GS2V away from the gate spacer GS1. In some embodiments, the gate spacer GS2 has an L-shape cross-section. The gate spacer GS3 is in contact with the gate spacer GS2. The gate spacer GS3 abuts a sidewall SW2 of the gate spacer GS2 and is disposed on the lateral portion GS2L of the gate spacer GS2. In some embodiments, the lateral portion GS1L of the gate spacer GS1 has an edge E aligned with the lateral portion GS2L of the gate spacer GS2 and the gate spacer GS3. The interlayer dielectric layer 320 is neighboring to the gate spacer GS1, the gate spacer GS2, and the gate spacer GS3. The CESL 310 is disposed between the interlayer dielectric layer 320 and the gate spacers GS1, GS2, GS3. More specifically, the CESL 310 is disposed between the interlayer dielectric layer 320 and each of the lateral portion GS1L of the gate spacer GS1, and the lateral portion GS2L of the gate spacer GS2.

Figure 16A:
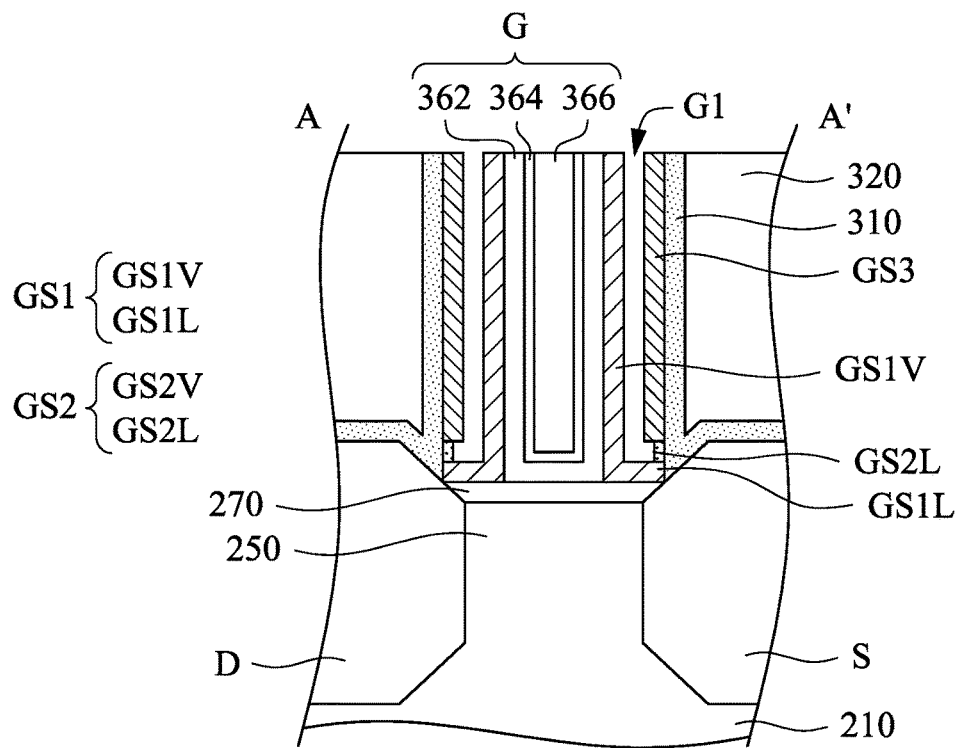
FIGS. 16A, 16B, 17A, 17B, 18, 19A, 19B, 20A, 20B, 21, 22A, 22B, 23A, 23B, and 24 are cross-sectional views illustrating intermediate stages in the manufacturing of a semiconductor structure, in accordance with some embodiments of the instant disclosure.
Figure 16B:
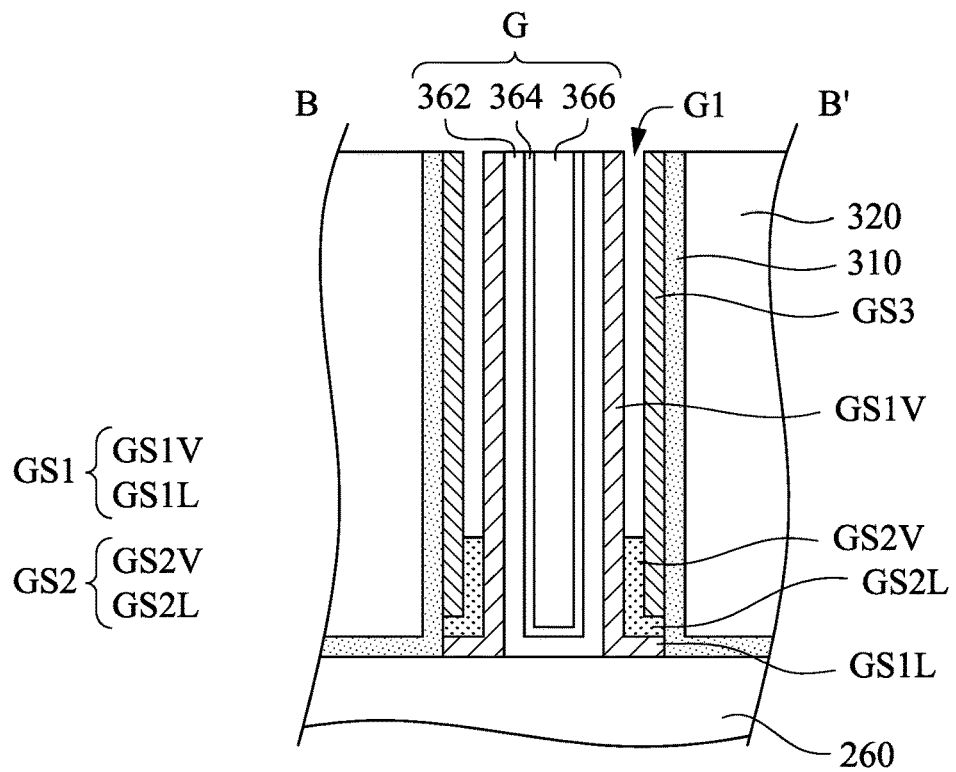

In operation 113 of FIG. 1, at least one portion of one of the gate spacers is removed. Reference is made to FIGS. 16A-16B. A portion of the gate spacer GS2 is removed to form a gap G1 between the gate spacer GS1 and the gate spacer GS3. In other words, the gate spacer GS2 is partially removed to form the gap G1. The gate spacer GS2 may act as a sacrificial gate spacer. As shown in FIG. 16A, a portion of the lateral portion GS2L of the gate spacer GS2 remains under the gate spacer GS3 and over the lateral portion GS1L of the gate spacer GS1. The remained lateral portion GS2L is under the gate spacer GS3 and over the lateral portion GS1L of the gate spacer GS1. As shown in FIG. 16B, a portion of the vertical portion GS2V of the gate spacer GS2 over the isolation dielectric layer 260 remains between the gate spacer GS1 and the gate spacer GS3. In some embodiments, the gate spacer GS2 is removed by an etching process, such as dry etching. In the removing process, only the gate spacer GS2 is removed. In some embodiments, the gate spacer GS2 includes or consists of a material different from that of the gate spacer GS1 and/or the gate spacer GS3. In some embodiments, the gate spacer GS2 has an etch resistance different from that of the gate spacer GS1 and/or the gate spacer GS3. In some embodiments, the gate spacer GS2 has an etch resistance lower than that of the gate spacer GS1 and/or the gate spacer GS3. In some other embodiments, the gate spacer GS2 may be entirely removed (not shown in FIGS. 16A-16B).

In the operation 115 of FIG. 1, a contact stop layer is formed over the gate structure, the gate spacers, and the interlayer dielectric layer to form an air gap. Attention is now invited to FIGS. 17A-17B. A contact stop layer CS1 is formed over the gate structure G, the gate spacers GS1, GS2, GS3, the CESL 310, and the interlayer dielectric layer 320 to form an air gap AR1 present between the gate spacer GS1, the contact stop layer CS1, and the interlayer dielectric layer 320. As such, a semiconductor structure 1700 is formed. The gate spacer GS3 is disposed between the air gap AR1 and the interlayer dielectric layer 320. The CESL 310 is disposed between the gate spacer GS3 and the interlayer dielectric layer 320. The contact stop layer CS1 includes a capping portion CP1 that seals a top of the air gap AR1. The capping portion CP1 extends toward the top of the air gap AR1. The air gap AR1 contacts the gate spacers GS1, GS3 and the capping portion CP1 of the contact stop layer CS1, and optionally the remained gate spacer GS2. The gate spacers GS1, GS3 (and optionally the remained gate spacer GS2) and the capping portion CP1 of the contact stop layer CS1 respectively constitute a portion of a boundary of the air gap AR1. In some embodiments, the contact stop layer CS1 further includes a horizontal layer HL1, and the capping portion CP1 extends downwards from the horizontal layer HL1 and to a position between the gate spacer GS1 and the gate spacer GS3 (or between the gate spacer GS1 and the interlayer dielectric layer 320).

Figure 17A:
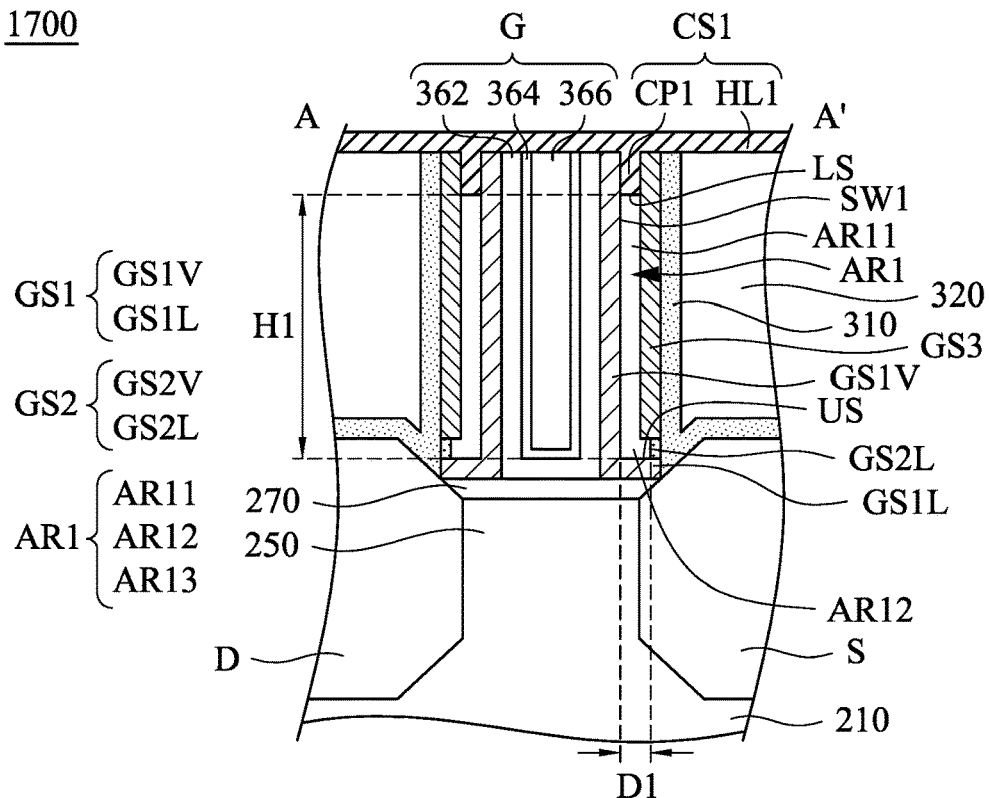
Figure 17B:
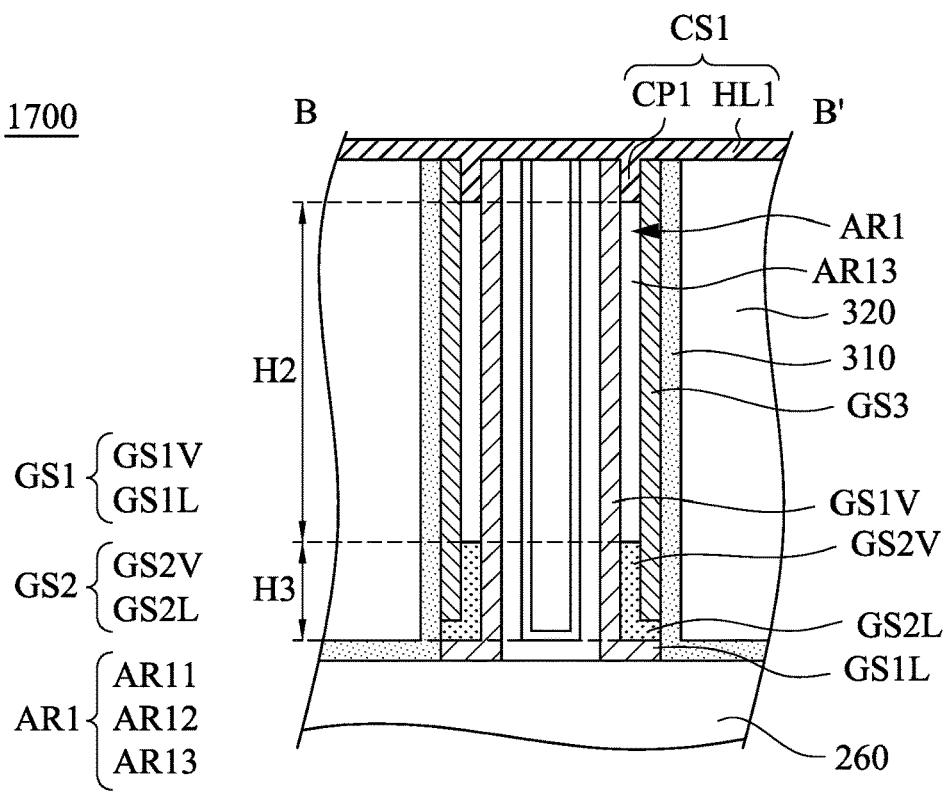

Referring to FIGS. 17A-17B simultaneously, the air gap AR1 has a first air gap portion AR11 and a second air gap portion AR12 communicated with the first air gap portion AR11 over the gate oxide layer 270 as shown in FIG. 17A. The air gap AR1 further has a third air gap portion AR13 over the isolation dielectric layer 260, as shown in FIG. 17B, communicated with the first air gap portion AR11 and the second air gap portion AR12. The first air gap portion AR11 is present between the vertical portion GS1V of the gate spacer GS1 and the gate spacer GS3. The second air gap portion AR12 is sandwiched between the gate spacer GS3 and the lateral portion GS1L of the gate spacer GS1. In some embodiments, a height H1 between a lower surface LS of the capping portion CP1 and an upper surface US of the lateral portion GS1V of the gate spacer GS1 ranges from about 10 Å to about 1000 Å. In some embodiments, a distance D1 between the remained lateral portion GS2L and the sidewall SW1 of the gate spacer GS1 ranges from about 2 Å to about 200 Å. In some embodiments, the third air gap portion AR13 has a height H2 ranges from about 10 Å to about 800 Å. In some embodiments, the remained vertical portion GS2V of the gate spacer GS2 shown in FIG. 17B has a height H3 ranged from about 2 Å to about 200 Å.

Figure 18:
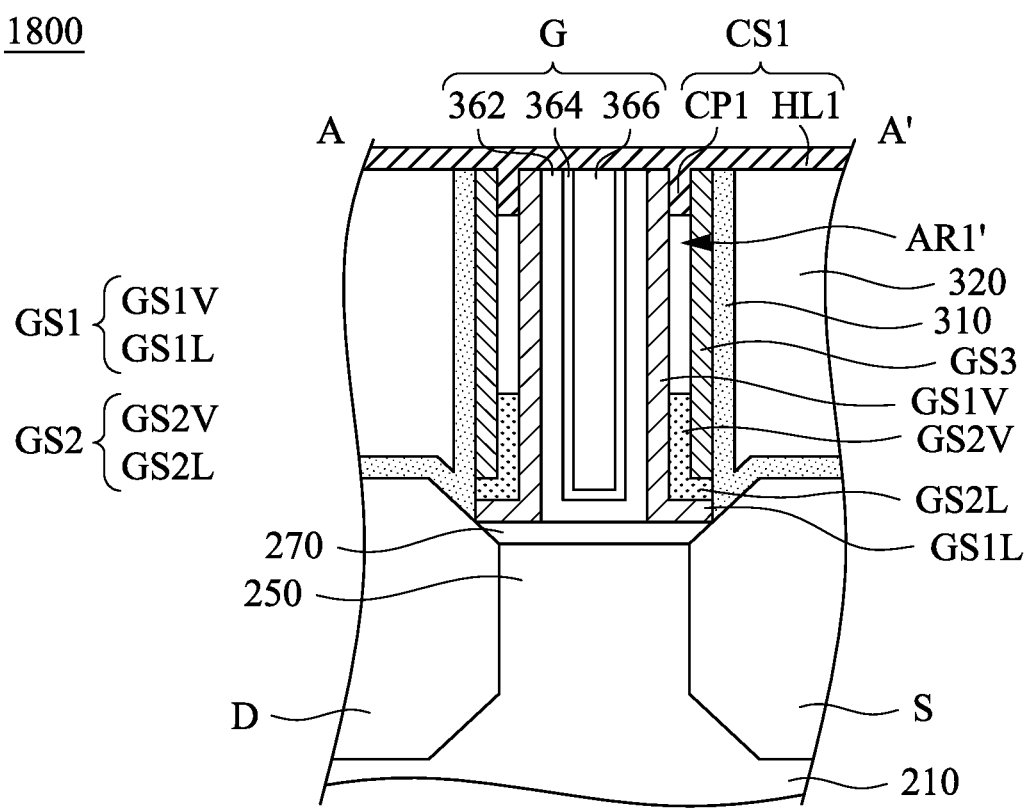

FIG. 18 is a cross-sectional view illustrating a semiconductor structure 1800, in accordance with yet some embodiments of the instant disclosure. The difference between the semiconductor structure 1800 shown in FIG. 18 and the semiconductor structure 1700 shown in FIG. 17A is that, after the operation 113, a portion of the vertical portion GS2V of the gate spacer GS2 of FIG. 18 remains between the gate spacer GS1 and the gate spacer GS3. Further, a portion of the lateral portion GS2L remains under the gate spacer GS3 and over the lateral portion GS1L of the gate spacer GS1. However, the gate spacer GS2 of FIG. 17A does not have the remained vertical portion GS2V between the gate spacer GS1 and the gate spacer GS3. As shown in FIG. 18, an air gap AR1' is disposed between the gate spacers GS1 and GS3 and between the gate spacer GS2 and the capping portion CP1 of the contact stop layer CS1, and contacts the gate spacers GS1, GS2, GS3 and the capping portion CP1 of the contact stop layer CS1.

Figure 19A:
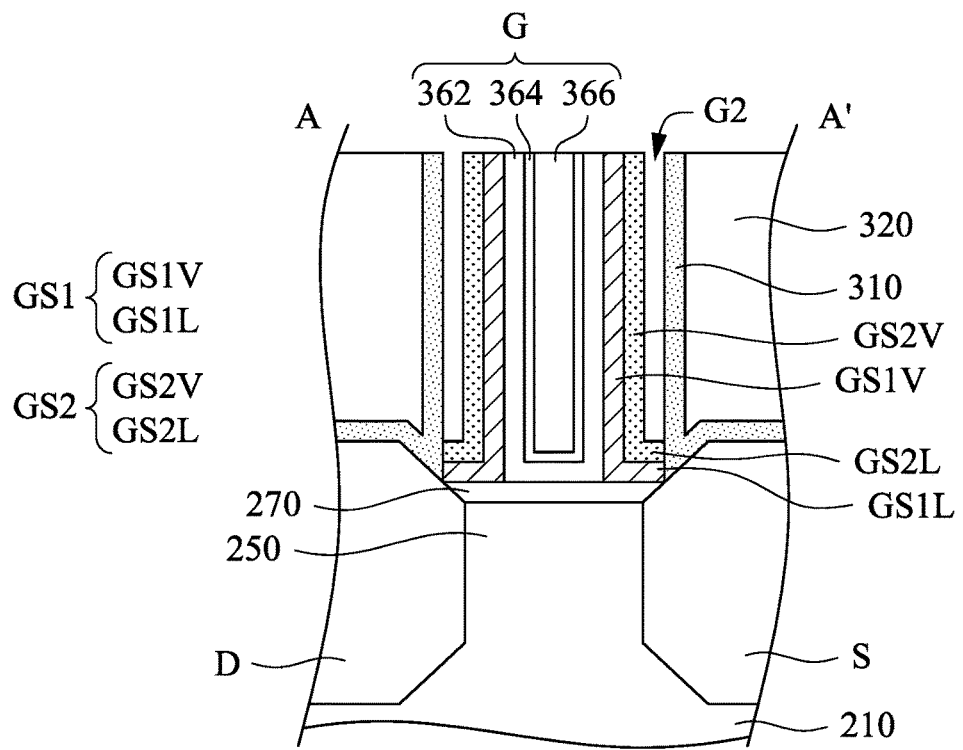
Figure 19B:
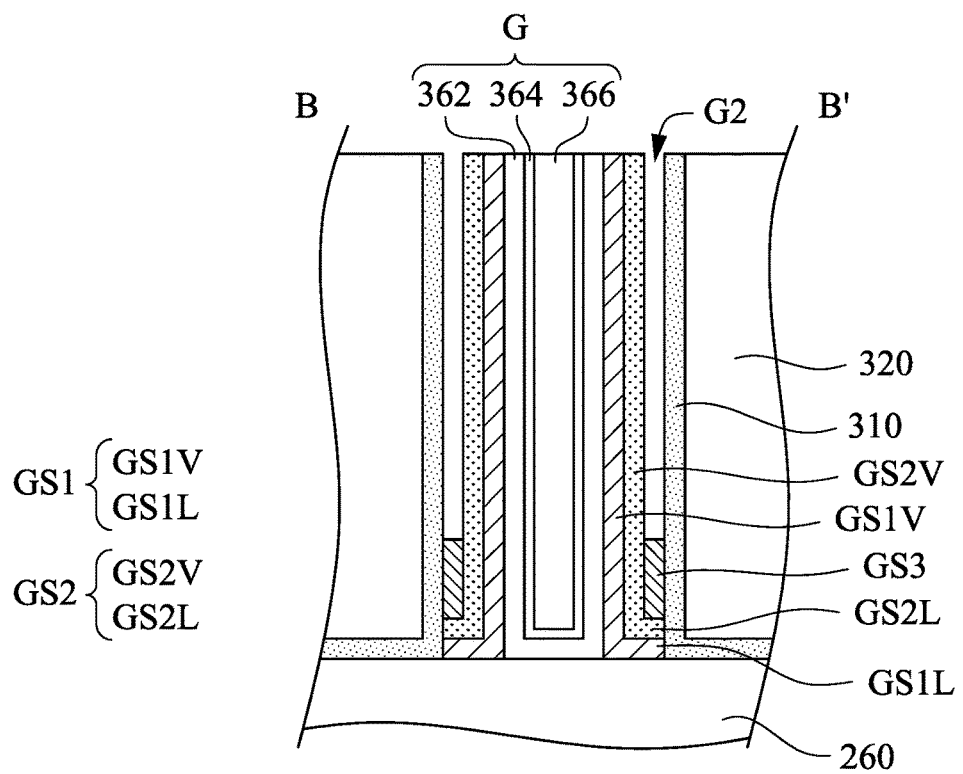

Reference is made to FIGS. 19A-19B, which are cross-sectional views illustrating the structure after the operation 113 of FIG. 1 is performed, according to yet some embodiments. A portion of the gate spacer GS3 is removed to form a gap G2 between the gate spacer GS2 and the CESL 310. The gate spacer GS3 may act as a sacrificial gate spacer. As shown in FIG. 19A, the portion of the gate spacer GS3 over the gate oxide layer 270 is entirely removed. As shown in FIG. 19B, however, the portion of the gate spacer GS3 over the isolation dielectric layer 260 remains between the gate spacer GS2 and the CESL 310. In yet some other embodiments, the portion of the gate spacer GS3 over the isolation dielectric layer 260 may be entirely removed (not shown in FIG. 19B). In some embodiments, the gate spacer GS3 is removed by an etching process, such as dry etching. In the removing operation shown in FIGS. 19A and 19B, only the gate spacer GS3 is removed. In some embodiments, the gate spacer GS3 includes or consists of a material different from that of the gate spacer GS2 and/or the CESL 310. In some embodiments, the gate spacer GS3 has an etch resistance different from that of the gate spacer GS2 and/or the CESL 310. In some embodiments, the gate spacer GS3 has an etch resistance lower than that of the gate spacer GS2 and/or the CESL 310.

Figure 20A:
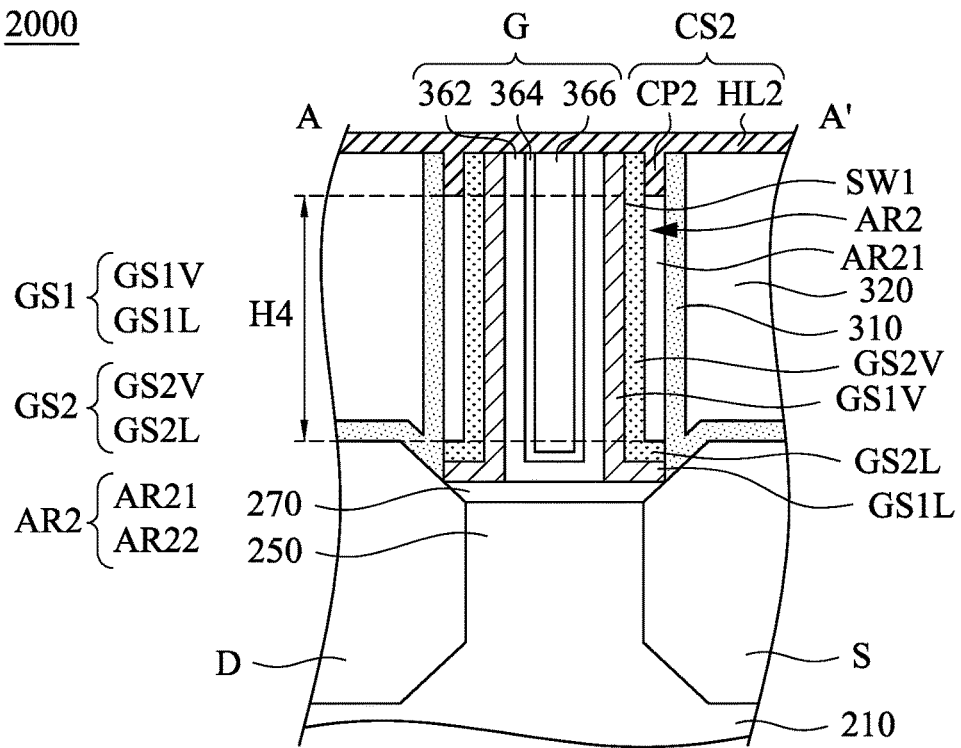
Figure 20B:
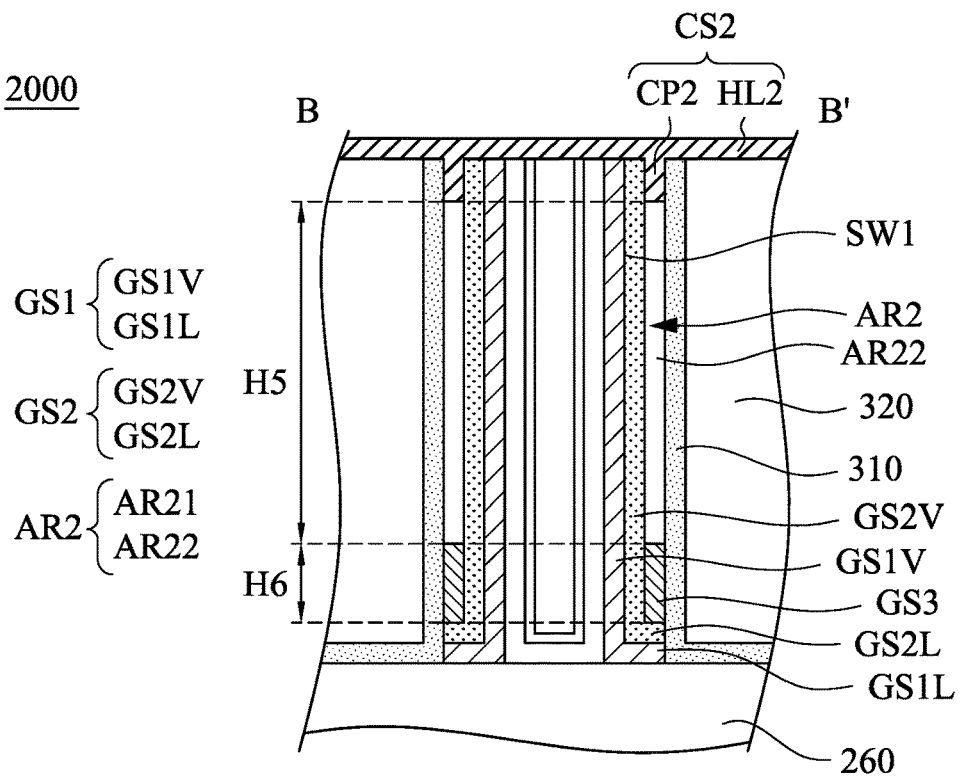

Attention is now invited to FIGS. 20A-20B, that are cross-sectional views illustrating the structure after the operation 115 of FIG. 1 is performed, according to yet some embodiments. A contact stop layer CS2 is formed over the gate structure G, the gate spacers GS1, GS2, the remained gate spacer GS3, the CESL 310, and the interlayer dielectric layer 320 to form an air gap AR2 present between the gate spacer GS1, the contact stop layer CS2, and the interlayer dielectric layer 320. As such, a semiconductor structure 2000 is formed. The gate spacer GS2 is disposed between the gate spacer GS1 and the air gap AR2. The CESL 310 is disposed between the gate spacers GS1, GS2 and the interlayer dielectric layer 320. The contact stop layer CS2 includes a capping portion CP2 that seals a top of the air gap AR2. The capping portion CP2 extends toward the top of the air gap AR2. The air gap AR2 contacts the gate spacer GS2, the remained spacer GS3, the capping portion CP2 of the contact stop layer CS2, and the CESL 310. The gate spacer GS2, the remained spacer GS3, the capping portion CP2 of the contact stop layer CS2, and the CESL 310 respectively constitute a portion of a boundary of the air gap AR2. In some embodiments, the contact stop layer CS2 further includes a horizontal layer HL2, and the capping portion CP2 extends downwards from the horizontal layer HL2 and to a position between the gate spacer GS2 and the CESL 310 (or between the gate spacer GS1 and the interlayer dielectric layer 320).

Referring to FIGS. 20A-20B simultaneously, the air gap AR2 has a first air gap portion AR21 on the gate oxide layer 270 as shown in FIG. 20A and a second air gap portion AR22 communicated with the first air gap portion AR21 on the isolation dielectric layer 260 as shown in FIG. 20B. The first air gap portion AR21 is present between the vertical portion GS2V of the gate spacer GS2 and the CESL 310, and directly over the lateral portion GS2L of the gate spacer GS2. The lateral portion GS2L of the gate spacer GS2 is under the first air gap portion AR21 of the air gap AR2. In some embodiments, the first air gap portion AR21 has a height H4 ranges from about 10 Å to about 800 Å. As shown in FIG. 20B, remained portion of the gate spacer GS3 is under the second air gap portion AR22. In some embodiments, the second air gap portion AR22 has a height H5 ranged from about 10 Å to about 600 Å. In some embodiments, the remained gate spacer GS3 shown in FIG. 20B has a height H6 of from about 2 Å to about 150 Å.

Figure 21:
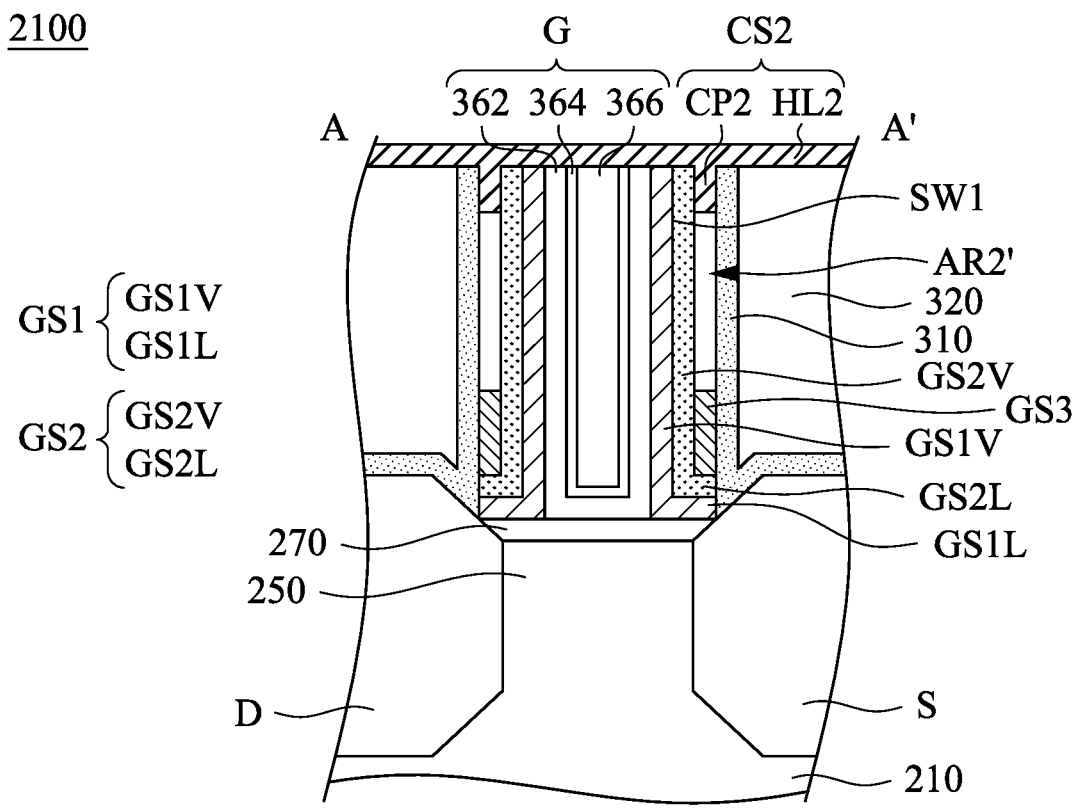

FIG. 21 is a cross-sectional view illustrating a semiconductor structure 2100, in accordance with yet some embodiments of the instant disclosure. The difference between the semiconductor structure 2100 shown in FIG. 21 and the semiconductor structure 2000 shown in FIG. 20A is that, after the operation 113, a portion of the gate spacer GS3 of FIG. 21 over the gate oxide layer 270 remains between the gate spacer GS2 and the CESL 310 and over the lateral portion GS2L of the gate spacer GS2. However, FIG. 20A shows the portion of gate spacer GS3 over the gate oxide layer 270 is entirely removed. As shown in FIG. 21, the remained portion of the gate spacer GS3 is under an air gap AR2'. The air gap AR2' is located between the gate spacer GS2 and the CESL 310, and between the remained gate spacer GS3 and the capping portion CP1 of the contact stop layer CS1. The air gap AR2' contacts the gate spacer GS2, the remained gate spacer GS3, the CESL 310 and the capping portion CP2 of the contact stop layer CS2.

Figure 22A:
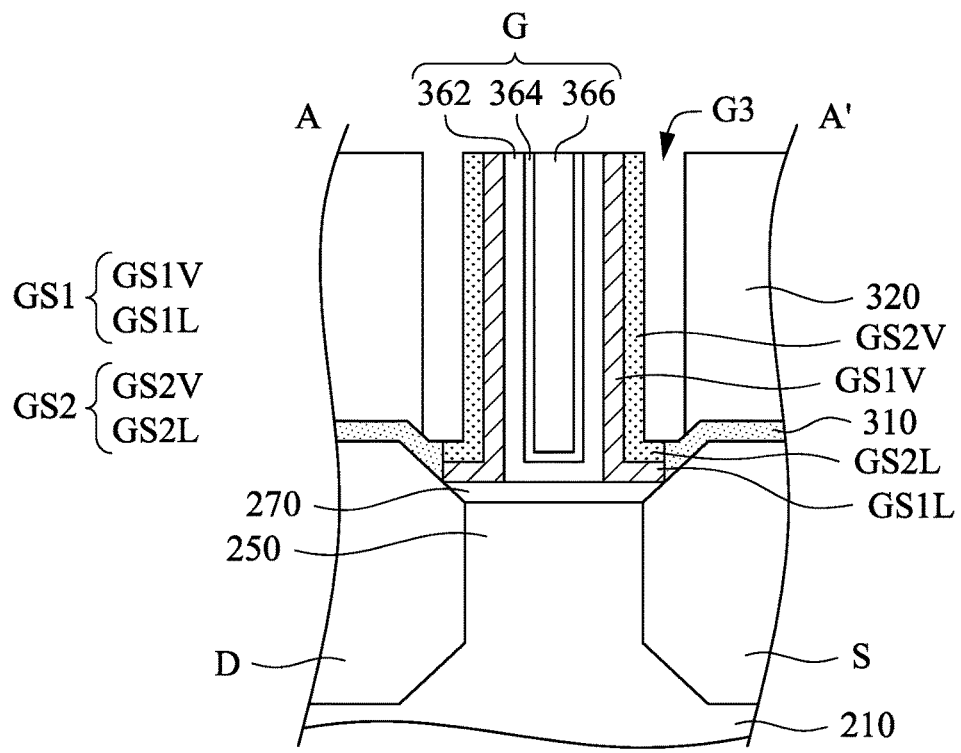
Figure 22B:
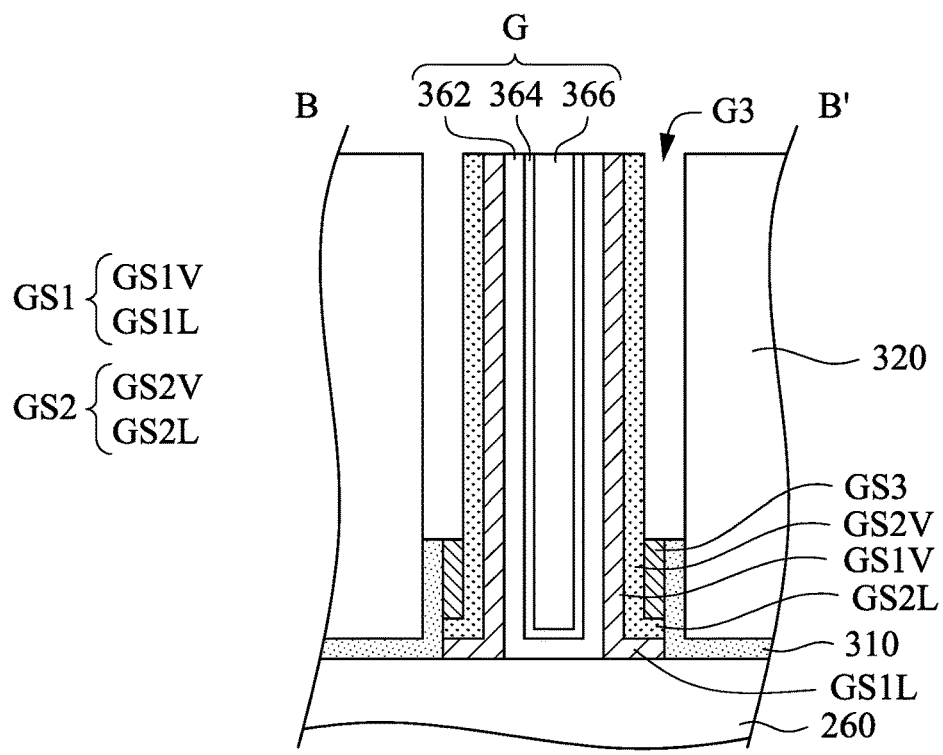

In yet some other embodiments, the method 100 may further include removing at least one portion of the contact etch stop layer. For example, the removal of the at least one portion of the contact etch stop layer may be performed before or after the operation 113. Alternatively, the removing the at least one portion of the contact etch stop layer and the operation 113 are performed concurrently. Reference is made to FIGS. 22A-22B. A portion of the gate spacer GS3 and a portion of the CESL 310 are removed to form a gap G3 between the gate spacer GS2 and the ILD layer 320. As shown in FIG. 22A, the gate spacer GS3 over the gate oxide layer 270 is entirely removed, and the CESL 310 is partially removed. As shown in FIG. 22B, the gate spacer GS3 and the CESL 310 on the isolation dielectric layer 260 are partially removed. A portion of the gate spacer GS3 remains over the lateral portion GS2L of the gate spacer GS2 and a portion of the CESL 310 remains next to the remained portion of the gate spacer GS3. In some embodiments, the gate spacer GS3 and the CESL 310 are removed by etching processes, such as dry etching processes. In some embodiments, the gate spacer GS3 includes or consists of a material different from that of the gate spacer GS2 and/or the CESL 310. In some embodiments, the gate spacer GS3 has an etch resistance different from that of the gate spacer GS2 and/or the CESL 310. In some embodiments, the gate spacer GS3 has an etch resistance lower than that of the gate spacer GS2 and/or the CESL 310. In some embodiments, the CESL 310 includes or consists of a material different from that of the interlayer dielectric layer 320. In some embodiments, the CESL 310 has an etch resistance different from that of the interlayer dielectric layer 320. In some embodiments, the CESL 310 has an etch resistance lower than that of the interlayer dielectric layer 320.

Figure 23A:
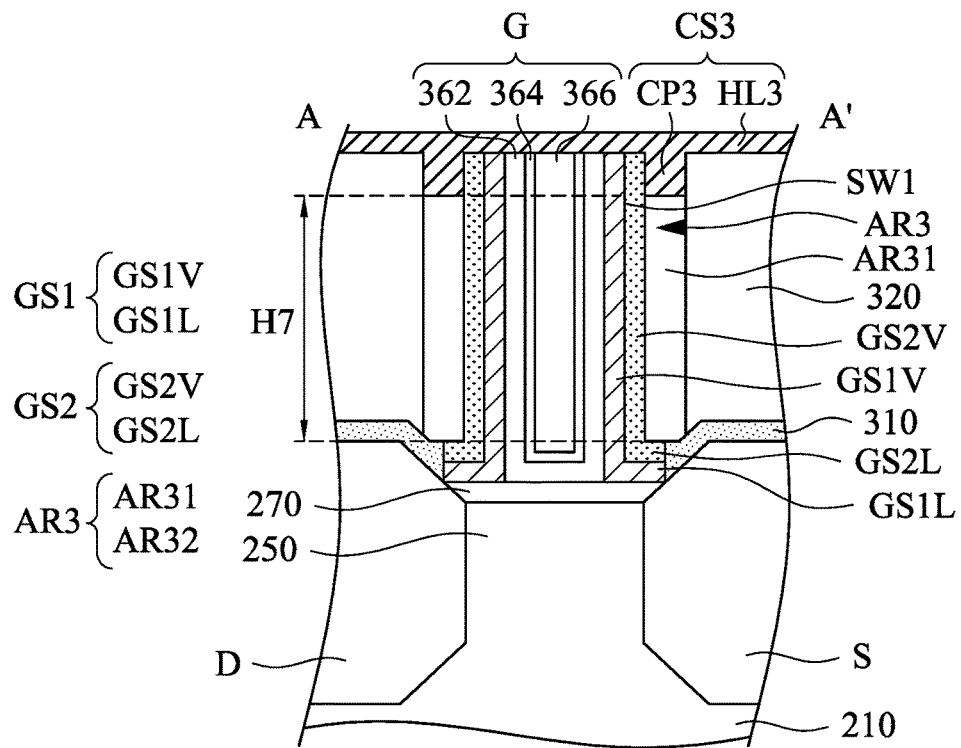
Figure 23B:
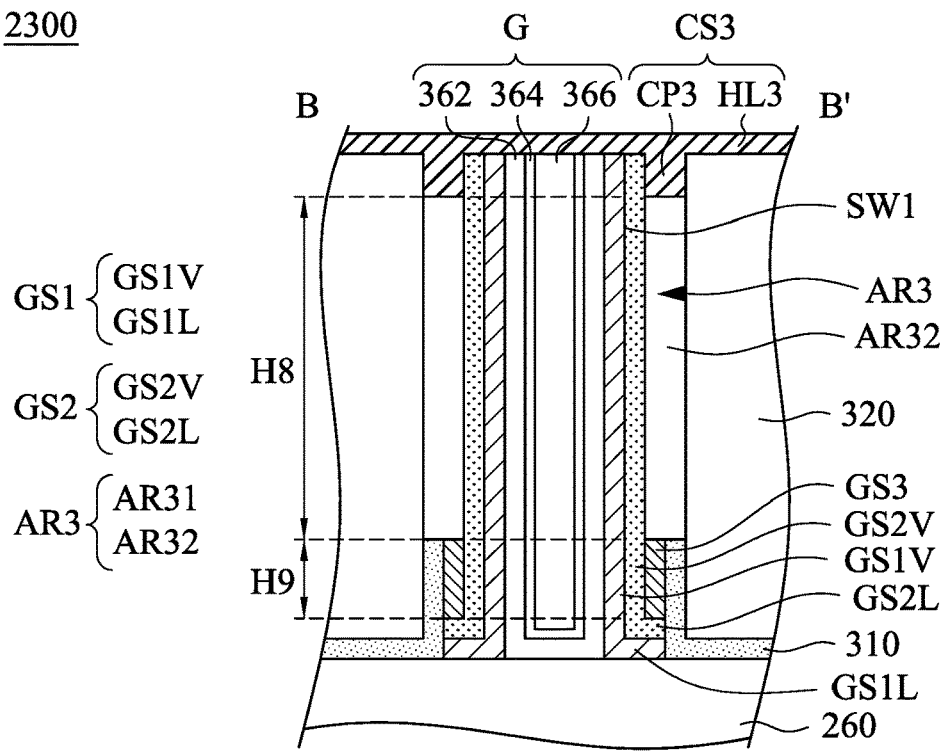

FIGS. 23A-23B are cross-sectional views illustrating the structure after the operation 115 of FIG. 1 is performed, according to yet some embodiments. A contact stop layer CS3 is formed over the gate structure G, the gate spacers GS1, GS2, the remained gate spacer GS3, the remained CESL 310, and the interlayer dielectric layer 320 to form an air gap AR3 present between the gate spacer GS1, the contact stop layer CS3, and the interlayer dielectric layer 320. As such, a semiconductor structure 2300 is formed. The gate spacer GS2 is disposed between the gate spacer GS1 and the air gap AR3. The remained CESL 310 is disposed between the gate spacers GS1, GS2 and the interlayer dielectric layer 320. The contact stop layer CS3 includes a capping portion CP3 that seals a top of the air gap AR3. The capping portion CP3 extends toward the top of the air gap AR3. The air gap AR3 contacts the gate spacer GS2, the remained gate spacer GS3, the capping portion CP3 of the contact stop layer CS3, the remained CESL 310, and the interlayer dielectric layer 320. The gate spacer GS2 and the remained gate spacer GS3, the capping portion CP3 of the contact stop layer CS3, the remained CESL 310, and the interlayer dielectric layer 320 respectively constitute a portion of a boundary of the air gap AR3. In some embodiments, the contact stop layer CS3 further includes a horizontal layer HL3, and the capping portion CP3 extends downwards from the horizontal layer HL3 and to a position between the gate spacer GS2 and the interlayer dielectric layer 320 (or between the gate spacer GS1 and the interlayer dielectric layer 320).

Please referring to FIGS. 23A-23B simultaneously, the air gap AR3 has a first air gap portion AR31 over the gate oxide layer 270 as shown in FIG. 23A and a second air gap portion AR32 over the isolation dielectric layer 260 that communicates with the first air gap portion AR31, as shown in FIG. 23B. The first air gap portion AR31 is present between the vertical portion GS2V of the gate spacer GS2 and the interlayer dielectric layer 320, and over the lateral portion GS2L of the gate spacer GS2 and the CESL 310. The lateral portion GS2L is under the air gap AR3. In some embodiments, the first air gap portion AR31 has a height H7 is of from about 10 Å to about 600 Å. As shown in FIG. 23B, portions of the gate spacer GS3 and the CESL 310 are disposed under the second air gap portion AR32. In some embodiments, the second air gap portion AR32 has a height H8 of from about 10 Å to about 600 Å. In some embodiments, the remaining gate spacer GS3 shown in FIG. 23B has a height H9 of from about 2 Å to about 150 Å.

Figure 24:
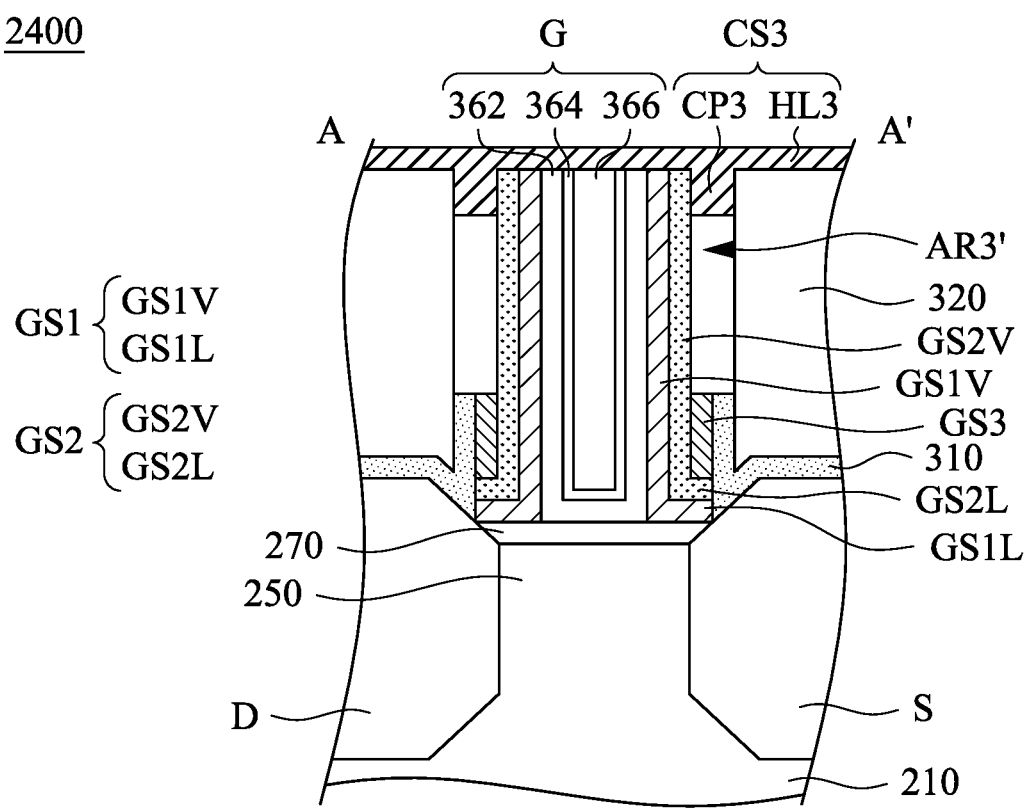

FIG. 24 is a cross-sectional view illustrating a semiconductor structure 2400, in accordance with some embodiments of the instant disclosure. The difference between the semiconductor structure 2400 shown in FIG. 24 and the semiconductor structure 2300 shown in FIG. 23A is that, after removing a portion of the gate spacer GS3 and a portion of the CESL 310, a portion of the gate spacer GS3 in FIG. 24 over the gate oxide layer 270 remains between the gate spacer GS2 and the CESL 310, and a portion of the CESL 310 in FIG. 24 over the gate oxide layer 270 remains between the gate spacer GS3 and the ILD layer 320. As shown in FIG. 24, the remained portion of the gate spacer GS3 and the remained portion of the CESL 310 are under an air gap AR3'. The air gap AR3' is disposed between the gate spacer GS2 and the ILD layer 320, and between the gate spacer GS3, the CESL 310, and the capping portion CP1 of the contact stop layer CS1. The air gap AR3' contacts the gate spacer GS2, remained gate spacer GS3, the remained CESL 310, the capping portion CP2 of the contact stop layer CS2, and the ILD layer 320.

For a semiconductor structure, such as fin effect transistor (FinFET), lowering the parasitic capacitance between the gates and the drains or between the gates and the sources is good for reducing the gate pitches. The instant disclosure provides the air gaps adjacent to the gate structures in various embodiments to lower the parasitic capacitance and to mitigate current leakage. Accordingly, the performance of the semiconductor structure is promoted.

According to some embodiments, a device includes a semiconductive fin having source and drain regions and a channel region between the source and drain regions, a gate feature over the channel region of the semiconductive fin, a first spacer around the gate feature, source and drain features respectively in the source and drain regions of the semiconductive fin, an interlayer dielectric layer around the first spacer, and a void between the first spacer and the interlayer dielectric layer and spaced apart from the gate feature and the source and drain features.

According to some embodiments, a device includes a semiconductive fin having source and drain regions and a channel region between the source and drain regions, a gate feature over the channel region of the semiconductive fin, a first spacer around the gate feature, a second spacer around the first spacer, a void between the first spacer and the second spacer, and source and drain features respectively in the source and drain regions of the semiconductive fin.

According to some embodiments, a device includes a semiconductive fin having source and drain regions and a channel region between the source and drain regions, a gate feature over the channel region of the semiconductive fin, a first spacer around the gate feature, source and drain features respectively in the source and drain regions of the semiconductive fin, an interlayer dielectric layer around the first spacer, a void between the first spacer and the interlayer dielectric layer, and a contact stop layer. The contact stop layer has a first portion directly over the gate feature, a second portion directly over the first spacer, and a third portion directly over the void, in which a bottom surface of the third portion of the contact stop layer is lower than a top surface of the first spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a semiconductive fin having source and drain regions and a channel region between the source and drain regions;
   an isolation dielectric layer surrounding a bottom of the semiconductive fin;
   a gate feature over the channel region of the semiconductive fin;
   a first spacer around the gate feature;
   source and drain features respectively in the source and drain regions of the semiconductive fin;
   a gate oxide layer extending from one of the source and drain features, through beneath the gate feature, to another one of the source and drain features;
   an interlayer dielectric layer around the first spacer; and
   a void between the first spacer and the interlayer dielectric layer and spaced apart from the gate feature and the source and drain features, wherein the void is directly above the gate oxide layer and has:
   a first air gap portion directly above the semiconductive fin;
   a second air gap portion directly above the isolation dielectric layer, wherein the first air gap portion and the second air gap portion have different heights; and
   a contact etch stop layer between the first spacer and the interlayer dielectric layer, wherein a top surface of the contact etch stop layer is lower than a top surface of the interlayer dielectric layer.

2. The device of claim 1, further comprising a second spacer around the first spacer, wherein a top surface of the second spacer is higher than the top surface of the contact etch stop layer.

3. The device of claim 2, further comprising a third spacer around the second spacer.

4. The device of claim 1, further comprising a second spacer around and spaced apart from the first spacer.

5. The device of claim 1, further comprising a second spacer around the first spacer, wherein the void is between the second spacer and the interlayer dielectric layer.

6. The device of claim 5, further comprising a third spacer around the second spacer, wherein a top surface of the third spacer is lower than a top surface of the second spacer and at least partially defines a bottom surface of the void.

7. The device of claim 5, wherein the first spacer has a first portion extending along sidewalls of the gate feature and a second portion extending laterally from a bottom end of the first portion of the first spacer, the second spacer has a first portion extending along sidewalls of the first portion of the first spacer and a second portion extending along a top surface of the second portion of the first spacer, and at least a portion of a top surface of the second portion of the second spacer at least partially defines a bottom surface of the void.

8. The device of claim 1, wherein the first spacer has a first portion extending along sidewalls of the gate feature and a second portion extending laterally from a bottom end of the first portion of the first spacer.

9. A device, comprising:
   a semiconductive fin having source and drain regions and a channel region between the source and drain regions;
   an isolation dielectric layer surrounding a bottom of the semiconductive fin;
   a gate feature over the channel region of the semiconductive fin;
   a first spacer around the gate feature;
   a second spacer around the first spacer;
   an interlayer dielectric layer around the second spacer;
   a void between the second spacer and the interlayer dielectric layer;
   source and drain features respectively in the source and drain regions of the semiconductive fin; and
   a contact etch stop layer between the second spacer and the interlayer dielectric layer, wherein a top surface of the contact etch stop layer is lower than a top surface of the interlayer dielectric layer.

10. The device of claim 9, further comprising a third spacer around the second spacer and defining the void.

11. The device of claim 10, wherein the third spacer has a top surface lower than the top surface of the interlayer dielectric layer.

12. A device, comprising:
    a semiconductive fin having source and drain regions and a channel region between the source and drain regions;
    a gate feature over the channel region of the semiconductive fin;
    a first spacer around and in contact with the gate feature;
    source and drain features respectively in the source and drain regions of the semiconductive fin;
    an interlayer dielectric layer around the first spacer;
    a void between the first spacer and the interlayer dielectric layer; and
    a contact stop layer having a first portion directly over the gate feature, a second portion directly over the first spacer, and a third portion directly over the void, wherein a bottom surface of the third portion of the contact stop layer is lower than a top surface of the first spacer; and
    a contact etch stop layer between the first spacer and the interlayer dielectric layer, wherein a top surface of the contact etch stop layer is lower than a top surface of the interlayer dielectric layer.

13. The device of claim 12, wherein the interlayer dielectric layer has a sidewall that faces the first spacer, and the contact stop layer is in contact with an upper portion of the sidewall of the interlayer dielectric layer.

14. The device of claim 12, further comprising an isolation dielectric layer surrounding a bottom of the semiconductive fin and under the gate feature, wherein a part of the third portion of the contact stop layer is directly over the isolation dielectric layer.

15. The device of claim 12, further comprising a second spacer over the first spacer and defining a bottom surface of the void, wherein the third portion of the contact stop layer is wider than the second spacer.

16. The device of claim 12, wherein the void exposes a sidewall of the interlayer dielectric layer.

17. The device of claim 12, wherein the void exposes the top surface of the contact etch stop layer.

18. The device of claim 1, wherein the top surface of the contact etch stop layer at least partially defines a bottom surface of the void.

19. The device of claim 1, wherein the interlayer dielectric layer has a side surface exposed in the void.

20. The device of claim 9, wherein the top surface of the contact etch stop layer is lower than a top surface of the first spacer.

* * * * *